(12) United States Patent
Tsang et al.

(10) Patent No.: US 10,304,648 B2
(45) Date of Patent: May 28, 2019

(54) SAFETY SWITCH AND ASSOCIATED METHODS

(71) Applicant: ROCKWELL AUTOMATION TECHNOLOGIES, INC., Mayfield Heights, OH (US)

(72) Inventors: Andrew L. Tsang, Lowell, MA (US); Burt Sacherski, Nashua, NH (US); Steven Robert Tambeau, Marlborough, MA (US); Arvind Ananthanarayanan, Medford, MA (US); James Edward Dogul, Hudson, NC (US); Todd Bubar, Hollis, NH (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 15/815,087

(22) Filed: Nov. 16, 2017

(65) Prior Publication Data

US 2018/0075995 A1 Mar. 15, 2018

Related U.S. Application Data

(62) Division of application No. 14/943,650, filed on Nov. 17, 2015, now Pat. No. 9,824,841.

(51) Int. Cl.
*H01H 3/02* (2006.01)
*G08B 13/12* (2006.01)
(Continued)

(52) U.S. Cl.
CPC ........... *H01H 71/50* (2013.01); *G08B 13/122* (2013.01); *G08B 21/187* (2013.01);
(Continued)

(58) Field of Classification Search
None
See application file for complete search history.

(56) References Cited

U.S. PATENT DOCUMENTS

| | | |
|---|---|---|
| 4,367,459 A | 1/1983 | Amir et al. |
| 4,736,194 A | 4/1988 | Sticksel |

(Continued)

FOREIGN PATENT DOCUMENTS

| | | |
|---|---|---|
| AU | 2007311656 A1 | 4/2008 |
| CA | 2380585 C | 10/2003 |

(Continued)

OTHER PUBLICATIONS

EN ISO 13849-1, Safety Performance Levels; Allen-Bradley; Apr. 2009; 26 pages.

(Continued)

*Primary Examiner* — Thomas S McCormack
(74) *Attorney, Agent, or Firm* — Quarles & Brady LLP

(57) ABSTRACT

A cable pull switch includes a polychotomous sensor configured to provide a reading of at least one of a plurality of values, the reading corresponding to a tension on a pull cable or a linear displacement of an end of a pull cable. A processor coupled to the polychotomous cable pull sensor configured to determine a rate of change of the value of the reading from the sensor and determine an occurrence of a cable pull event, the determination based on the determined rate of change of the value, and determine whether the rate of change of the value of an electrical resistance through the polychotomous cable pull sensor is below a threshold rate of change value, and adjust an upper pull threshold value to a new upper pull threshold value that is based on a present reading of the value of the electrical resistance through the strain gauge.

18 Claims, 14 Drawing Sheets

(51) Int. Cl.
*G08B 21/18* (2006.01)
*H01H 71/50* (2006.01)

(52) U.S. Cl.
CPC ..... *H01H 3/0226* (2013.01); *H01H 2239/052* (2013.01); *H03K 2217/94026* (2013.01); *H03K 2217/9651* (2013.01)

(56) References Cited

U.S. PATENT DOCUMENTS

| | | | |
|---|---|---|---|
| 4,825,069 | A | 4/1989 | Hutchisson et al. |
| 4,829,287 | A | 5/1989 | Kerr et al. |
| 4,929,926 | A | 5/1990 | Porat |
| 5,236,144 | A | 8/1993 | Kautz |
| 5,371,488 | A | 12/1994 | Couch et al. |
| 5,665,947 | A | 9/1997 | Falcon |
| 6,087,934 | A | 7/2000 | Golab |
| 6,348,911 | B1 | 2/2002 | Rosenberg et al. |
| 6,644,465 | B1 | 11/2003 | Dube |
| 7,134,241 | B2 | 11/2006 | Suzuki |
| 7,222,839 | B2 | 6/2007 | Taylor et al. |
| 7,271,355 | B2 | 9/2007 | Yu |
| 8,089,012 | B2 * | 1/2012 | Mohtasham ............. H01H 3/42 200/334 |
| 8,118,152 | B2 | 2/2012 | Poyner et al. |
| 8,591,198 | B2 | 11/2013 | Kochan, Jr. et al. |
| 9,824,841 | B2 | 11/2017 | Tsang et al. |
| 2002/0035878 | A1 | 3/2002 | Norton |
| 2005/0121301 | A1 | 6/2005 | Hall et al. |
| 2008/0095196 | A1 | 4/2008 | Weatherhead et al. |
| 2008/0098401 | A1 | 4/2008 | Weatherhead et al. |
| 2008/0289937 | A1 | 11/2008 | Poyner |
| 2009/0083956 | A1 | 4/2009 | Ulfik et al. |
| 2010/0030345 | A1 | 2/2010 | Cole et al. |
| 2012/0061633 | A1 | 3/2012 | Holley |
| 2012/0138883 | A1 * | 6/2012 | Gallagher ................ A01K 3/00 256/47 |
| 2015/0014904 | A1 | 1/2015 | Tirelli |
| 2017/0248481 | A1 | 8/2017 | Bubar et al. |

FOREIGN PATENT DOCUMENTS

| | | |
|---|---|---|
| CN | 201029085 | 2/2008 |
| CN | 101565128 U | 10/2009 |
| CN | 201882596 U | 6/2011 |
| CN | 202481719 U | 10/2012 |
| CN | 103528742 A | 1/2014 |
| DE | 202007013591 U1 | 1/2008 |
| EP | 1 101 681 B1 | 11/2003 |
| JP | 2000106051 A | 4/2000 |
| JP | 2007052278 A | 3/2007 |
| WO | 1997020334 A1 | 6/1997 |
| WO | 2002095779 A1 | 11/2002 |
| WO | 2010137998 A2 | 12/2010 |
| WO | 2012047117 A1 | 4/2012 |

OTHER PUBLICATIONS

European Patent Office, Partial European Search Report, Application No. 16199315.9, dated May 2, 2017, 13 pages.
European Patent Office, Extended European Search Report, Application No. 16199315.9, dated Jul. 20, 2017, 12 pages.
IDEM Safety Switches Limited, Guardian Line Series Grab Wire Safety Rope Switches, http://www.idemsafety.com/products.asp?catid=29, last visited Mar. 14, 2017, 4 pages.
Wikipedia, Safety Integrity Level, https://en.wikipedia.org/wiki/Safety_integrity_level, Last Edited on Feb. 26, 2017, 5 pages.

* cited by examiner

| | OUTPUTS | | | INPUTS | | | NOTES |
|---|---|---|---|---|---|---|---|
| STATE | OSSD | AUX | LED | E-STOP | RESET BUTTON | TENSION | |
| INITIALIZATION | OFF | ON | YELLOW | INACTIVE | INACTIVE | ANYTHING | JUST POWERED UP SELF CHECKS |
| OFF | OFF | ON | RED | INACTIVE | INACTIVE | NOT NOMINAL | CHECKS TENSIONING, MOVES TO TENSIONED OFF IF APPROPRIATE |
| TENSIONED OFF | OFF | ON | RED/YELLOW | INACTIVE | INACTIVE | NOMINAL | HIT RESET GO TO TENSIONED RUN |
| TENSIONED RUN | ON | OFF | SOLID GREEN | INACTIVE | INACTIVE | NOMINAL | HIT E-STOP, PULL, OR SLACK TO OFF |
| PULLED | OFF | ON | SOLID RED | INACTIVE | INACTIVE | TRIP + OR VELOCITY | GOES TO OFF |
| SLACK | OFF | ON | BLINKING RED | INACTIVE | INACTIVE | TRIP − | GOES TO OFF |
| MARGINAL TENSION RUN | ON | OFF | BLINKING GREEN | INACTIVE | INACTIVE | MARGINAL + OR − | TENSIONING ADJUSTMENT NEEDED |

FIG. 12 though "This application is a divisional application of U.S. patent application Ser. No. 14/943,650, filed Nov. 17, 2015, and entitled "An Improved Safety Switch and Associated Methods," which is incorporated herein by reference."

SAFETY SWITCH AND ASSOCIATED METHODS

CROSS-REFERENCES TO RELATED APPLICATIONS

This application is a divisional application of U.S. patent application Ser. No. 14/943,650, filed Nov. 17, 2015, and entitled "An Improved Safety Switch and Associated Methods," which is incorporated herein by reference.

FIELD OF THE INVENTION

The present disclosure generally relates to methods and systems for a safety switch, and more particularly to new methods and apparatuses to implement a cable pull safety switch feature.

BACKGROUND

Emergency stop devices are devices that help ensure safe working conditions for personnel working in and around machinery. Such machinery may exist, for example, in factory settings, manufacturing settings, agricultural settings, foundry settings, warehouse settings, or other industrial settings. Often, the machinery (e.g., industrial presses, die machines, milling machines, molding machines, robotics, conveyor belts, etc.) may include moving parts or other hazards that can be dangerous to the personnel working around the machinery. In the event of a dangerous situation where the safety of a worker may need to be maintained, an emergency stop device can be actuated to immediately cease operation of the particular machine. By providing one or more emergency stop devices within quick reach of workers, injury can be avoided or mitigated.

One commonly used emergency stop device is a cable pull switch (also called a grab wire switch, a safety rope switch, or other similar names). A cable pull switch is coupled to one or both ends of a relatively inelastic cable (e.g., a steel cable). When properly installed, pull cable exerts a tension on the cable pull switch. So configured, a long distance (e.g., 100 meter or more) of pull cable can provide a nearly continuous emergency stop function that is easily activated around machinery or along conveyor belts. Any notable deflection or force exerted on the pull cable (e.g., by a worker pulling on the pull cable) can trigger the cable pull switch to effect an emergency stop of the machinery or equipment to which it is connected.

Existing cable pull switches utilize mechanical contact blocks with binary on/off or open/closed states. These existing cable pull switches act like a snap action switch where a transition between an on and off state occurs almost instantaneously in reaction to the worker pulling the pull cable. When a worker pulls the pull cable, a portion of the pull cable is deflected, which results in a linear displacement of the end of the pull cable coupled to the cable pull switch. When the linear deflection at the cable pull switch exceeds a threshold, the contact blocks become activated (e.g., with snap action) and the emergency stop is implemented. Additionally, many cable pull switches protect against pull cable failure by implementing an emergency stop if the pull cable enters a slack condition (e.g., not enough tension exerted by the pull cable on the switch) or a cut condition (no tension on the cable and none at the switch). To implement this, existing pull switches may have a second mechanical contact block that becomes activated when the linear displacement of the end of the cable connected to the pull cable is reduced by action of a tensioning spring within the cable pull switch as the cable enters the slack or cut condition, or utilize an unstable system where too much or too little tension causes a mechanism to actuate the contact block.

The linear physical positions of the activation points of the contact blocks and mechanism dictate the thresholds of operation of the cable pull switch. These thresholds are not easily altered, and therefore require careful adjustment of the tension of the pull cable during operation and repeated checks and adjustments over the lifetime of the pull cable installation (for example, as the cable stretches to generate slack or as the temperature changes in a particular application setting). Existing cable pull switches utilize a mark on the movable portion of the cable pull switch (e.g., a shaft connected to the pull cable), which is then compared to a mark on the cable pull switch body to determine if a length of the pull cable is adjusted such that the proper tension is exerted on the pull cable by the cable pull switch. The tension of the pull cable is often adjusted with one or more turnbuckles or with a cable tensioning system. Though suitable for at least some purposes, such approaches do not necessarily meet all needs of all application settings and/or all users. For example, a technician installing or adjusting the tension on the pull cable may have to adjust elements that are located a distance from the cable pull switch (e.g., 25 meters or more), in which case the technician (e.g., if working alone) would have to iteratively walk between the adjustment location and the cable pull switch to properly adjust the tension.

Further, because the positions of the activation points of the contact blocks dictate the thresholds of operation of the cable pull switch, tension on the pull cable may have to be adjusted more often to account for thermal expansion/contraction. The thresholds are often fairly close together to allow for easy detection of a pull on the cable, thereby creating a safer environment. However, the close threshold may create a false trigger situation if the pull cable were to expand or contact due to thermal changes.

Additionally, present cable pull switches are susceptible to jamming or other conditions rendering the cable pull switch incapable of registering a cable pull event. For example, a shaft of the cable pull switch may become deformed or damaged or the cable may become pinched. Present systems are unable to detect a jamming situation until a user pulls on the cable. Accordingly, technicians or other maintenance crew are required to perform routine checking of pull cable systems to ensure proper operation and to ensure that a previously undetected physical deformity in the cable pull system has not rendered the system inoperable.

Additionally, existing cable pull switches are binary in operation, both in their output signal and in their method of detection. Accordingly, existing cable pull switches lack a dynamic response to environmental and situational changes and are therefore limited in their flexibility and application.

SUMMARY

In one embodiment, a cable pull switch is described. The cable pull switch comprises a polychotomous cable pull sensor configured to provide a reading comprising at least one of a plurality of values, the reading corresponding to at least one of a tension on a pull cable or a linear displacement of a first end of a pull cable, and at least one processor coupled to the polychotomous cable pull sensor. The processor configured to determine a rate of change of the value of the reading from the sensor, and determine an occurrence of a cable pull event, the determination based at least in part on the determined rate of change of the value. The at least one processor of the cable pull switch may further determine whether the rate of change of the value of an electrical resistance through the polychotomous cable pull sensor is below a threshold rate of change value, and adjust an upper pull threshold value to a new upper pull threshold value that is based on a present reading of the value of the electrical resistance through the strain gauge. The at least one processor of the cable pull switch may further determine whether the reading is below a lower slack threshold value, the lower slack threshold value indicative of a cable slack event, and generate an output signal indicative of the cable slack event in response to determining that the reading is below the lower slack threshold value.

In another embodiment, a cable pull switch is described. The cable pull switch comprising a polychotomous cable pull sensor configured to provide a reading comprising at least one of a plurality of values, the reading corresponding to at least one of a tension on a pull cable or a linear displacement of a first end of a pull cable. The cable pull switch further comprising at least one processing device coupled to the cable pull sensor. The processing device configured to receive the reading the cable pull sensor; determine whether a value of the reading is outside of a non-tripped value window, a first limit edge side of the non-tripped value window comprising a pull threshold value, the pull threshold value being indicative of a cable pull event; and generate an output signal indicative of the cable pull event in response to determining that the value of the reading is outside of the non-tripped value window on the first limit edge side. The at least one processing device may be further configured to determine whether the value of the reading is outside of the non-tripped value window, a second limit edge side of the non-tripped value window comprising a slack threshold, the slack threshold indicative of a cable slack event, and generate an output signal indicative of the cable slack event in response to determining that the value of the reading is outside of the non-tripped value window on the second limit edge side. The at least one processing device may be further configured to determine whether the reading is below a lower slack threshold value, the lower slack threshold value indicative of a cable slack event, and generate an output signal indicative of the cable slack event in response to determining that the reading is below the lower slack threshold value.

In another embodiment, a cable pull switch is described. The cable pull switch comprising a polychotomous cable pull sensor configured to provide a reading comprising at least one of a plurality of values, the reading corresponding to at least one of a tension on a pull cable or a linear displacement of a first end of a pull cable. The cable pull switch further comprising at least one processor coupled to the cable pull sensor. The processor configured to determine a rate of change of the value of the reading from the sensor, determine whether a rate of change of the reading is outside of a non-tripped value window, a first limit edge side of the non-tripped value window comprising a threshold value, the pull threshold value being indicative of a cable pull event, and determine an occurrence of a cable pull event based on determining that rate of change of the value of the reading is outside of the non-tripped value window on the first limit edge side. The at least one processor may be further configured to determine whether the value of the reading is outside of the non-tripped value window, a second limit edge side of the non-tripped value window comprising a slack threshold, the slack threshold indicative of a cable slack event, and generate an output signal indicative of the cable slack event in response to determining that the value of the reading is outside of the non-tripped value window on the second limit edge side. The at least one processor may be further configured to determine whether the value of the linear displacement is outside of the non-tripped value window on the first limit edge side by determining whether the value of displacement exceeds the pull threshold value.

In another embodiment, a cable pull switch is described. The cable pull switch comprising a polychotomous cable pull sensor configured to provide a reading comprising at least one of a plurality of values, the reading corresponding to at least one of a tension on a pull cable or a linear displacement of a first end of a pull cable. The cable pull switch further comprising at least one processor coupled to the polychotomous cable pull sensor. The processor configured to continuously monitor the reading; determine a rate of change of the value of the reading from the sensor; periodically adjust an upper pull threshold value at a fixed interval of time if the rate of change of the value of the reading from the sensor is below a rate of change threshold; periodically adjust a lower slack threshold value at the fixed interval of time if the rate of change of the value of the reading from the sensor is below a rate of change threshold; and determine an occurrence of a cable pull event, the determination based at least in part on the determined rate of change of the value.

In another embodiment, an apparatus comprising a cable pull switch is described. The cable pull switch including a substrate configured to couple to a first end of a pull cable and configured to experience a variable mechanical stress related to a tension exerted by the pull cable. The cable pull switch further includes an electrical strain gauge bonded to the substrate and configured to alter an electrical resistance through the strain gauge in proportion to the variable mechanical stress experienced by the substrate; and at least one processing device coupled to the strain gauge. The processing device configured to receive an indication of the value of the electrical resistance through the strain gauge; determine whether the value of the electrical resistance through the strain gauge exceeds an upper pull threshold value, the upper pull threshold value being indicative of a cable pull event; and generate an output signal indicative of the cable pull event in response to determining that the electrical resistance through the strain gauge exceeds the upper pull threshold value. The cable pull switch may further include a spring loaded shaft coupled to the substrate, the spring loaded shaft configured to be coupled to the pull cable and to slide along a longitudinal axis of the shaft to translate a tension exerted by the pull cable to the substrate. The substrate may be a metal substrate.

In a further embodiment, an apparatus comprising a cable pull switch configured to be coupled to a first end of a pull cable is described. The cable pull switch comprising a linear optical sensor array configured to measure a linear displacement of the first end of a pull cable. The cable pull switch further comprises at least one processing device coupled to the linear optical sensor array. The processing device configured to receive from the linear optical sensor array a signal indicative of the value of displacement of the first end of the pull cable; determine whether the value of displacement is outside of a non-tripped value window on a first side of the non-tripped value window defined by a pull threshold value, the pull threshold value being indicative of a cable pull event; and generate an output signal indicative of the cable pull event in response to determining that the value of displacement is outside of the non-tripped value window on the first side.

In a further embodiment, a cable pull switch is described. The cable pull switch comprising a spring configured to couple to a first end of a pull cable and configured to at least one of linearly compress or linearly expand in relation to a linear displacement of the first end of the pull cable. The cable pull switch further comprising an electrical inductance sensor electrically coupled to the spring and configured to sense an electrical inductance value of the spring and to sense a change in the electrical inductance value of the spring in relationship to at least one of a linear compression or a linear expansion of the spring, and at least one processing device coupled to the electrical inductance sensor. The at least one processing device configured to receive from the electrical inductance sensor a signal indicative of the electrical inductance value of the spring; determine whether the electrical inductance value is outside of a non-tripped value window on a first side of the non-tripped value window defined by a pull threshold value, the pull threshold value being indicative of a cable pull event; and generate an output signal indicative of the cable pull event in response to determining that the electrical inductance value is outside of the non-tripped value window on the first side.

In another embodiment, a cable pull switch is described. The cable pull switch comprising an illuminator configured to output a visual indication corresponding to a requirement to at least one of increase or decrease the tension exerted by a pull cable coupled to the cable pull switch while in a pull cable tension adjustment state.

In further embodiment, a system is described. The system comprising a cable pull switch configured to couple to a first end of a pull cable. The system further comprising a pull cable excitation module configured to couple to a second end of the pull cable; enter a pull cable excitation state by varying a tension exerted on the second end of the pull cable; and communicate with the cable pull switch to initiate the pull cable excitation state. Wherein the cable pull switch is further configured to detect at the first end of the pull cable the carrying tension exerted on the second end of the pull cable during the pull cable excitation state; and generate an output signal indicative of a pull cable failure in response to failing to detect the varying tension during the pull cable excitation state.

These and other benefits may become clearer upon making a thorough review and study of the following detailed description. Further, while the embodiments discussed above a listed as individual embodiment, it is to be understood that the above embodiments, including all elements contained therein, can be combined in whole or in part.

DESCRIPTION OF THE DRAWINGS

FIG. 12 shows an example state table of operational states of the cable pull switch of FIG. 2 in accordance with various embodiments;

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

Figure 1:
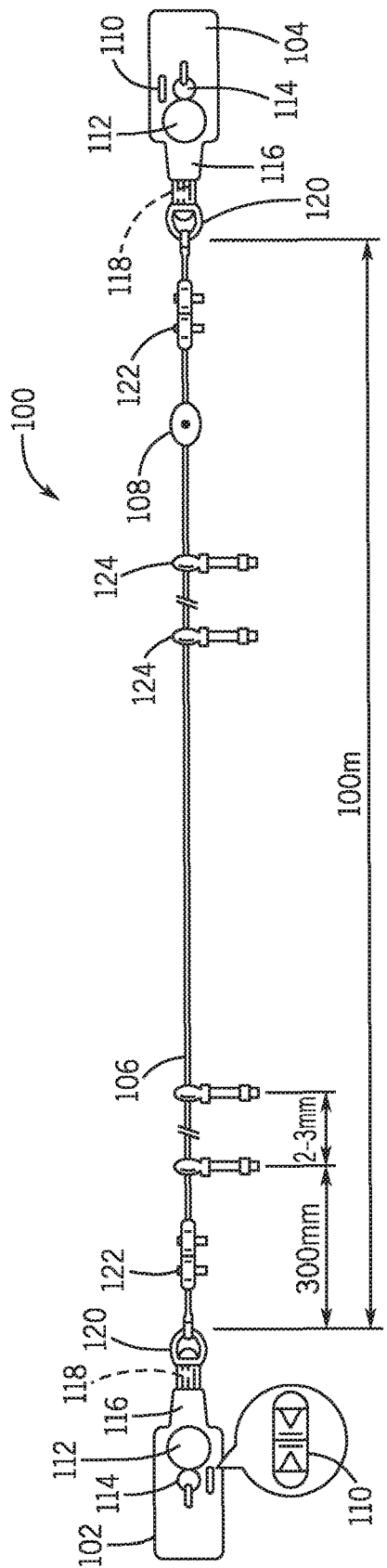
FIG. 1 is an illustration of an example contextual implementation of a cable pull system in accordance with various embodiments.

Referring now to the figures, FIG. 1 illustrates an example contextual implementation of a cable pull system 100 in accordance with various embodiments. The cable pull system 100 includes a first cable pull switch 102, an optional second cable pull switch 104, a pull cable 106 extending between the switches, and an optional tensioner 108 installed along the pull cable 106.

In prior art application settings, the cable pull switches 102, 104 may be of any suitable contact-based design, for example, as is described in U.S. Pat. No. 6,365,850 to Arnold et al., the contents of which are incorporated by reference. The cable pull switches 102 and 104 may each comprise a tension indicator 110, an emergency stop button 112, and a reset knob 114. Each cable pull switch 102, 104 may also comprise a tubular body extension 116 which receives a spring-loaded shaft 118 (shown in phantom) attached to a rotatable D-ring connector 120. The switches are mounted such that the distance between the D-ring connector 120 is generally less than 100 meters, though other distances may be suitable in various application settings.

In various embodiments, the pull cable 106 can be a PVC coated steel cable, although any suitable cable may be used. The pull cable 106 may be attached between the cable pull switches 102, 104 by passing the cable around suitable thimbles looped through the D-ring connector 120 and clamping the cable ends in clamps 122, in a known manner. The pull cable 106 is typically supported along its length by means of a plurality of eye bolts 124 placed at distances of 2 to 3 meters apart along the machinery.

Figure 2:
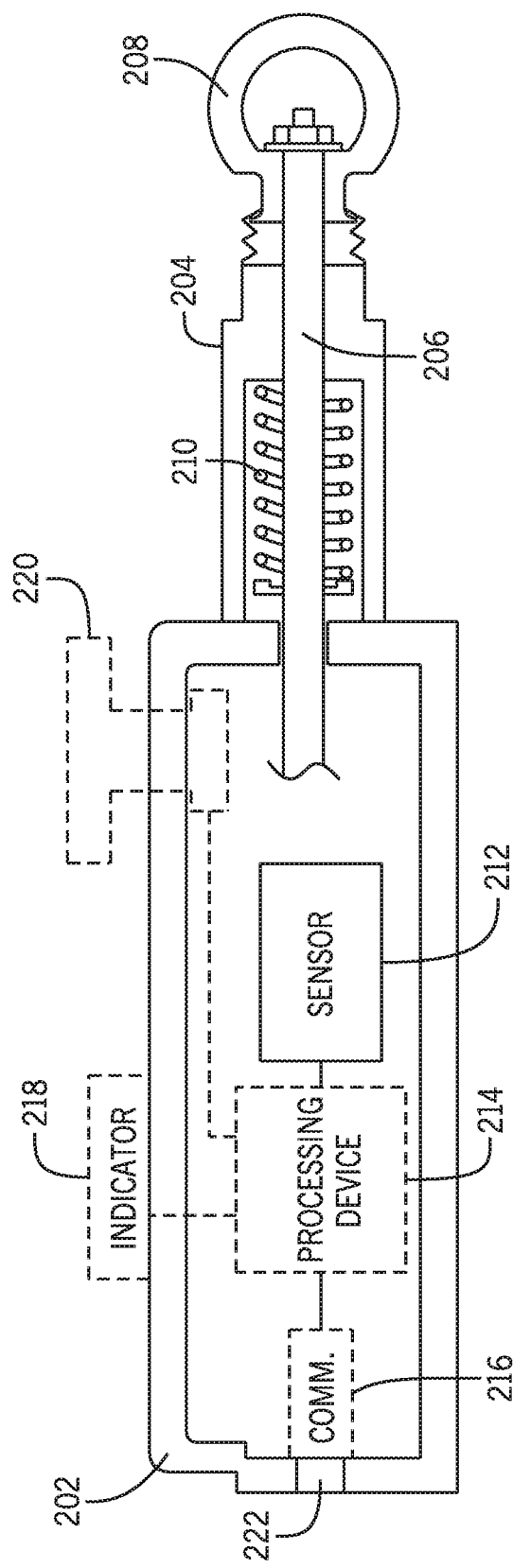
FIG. 2 shows a cable pull switch in accordance with various embodiments.

Turning now to FIG. 2, an improved cable pull switch 200 is illustrated in accordance with various embodiments. Like the cable pull switch 102 of FIG. 1, the cable pull switch 200 includes a housing 202 and may include a tubular body extension 204 (similar to or the same as tubular body extension 116 discussed above) through which a shaft 206 passes, however, the tubular body extension 204 is not required in all embodiments. A rotatable D-ring 208 connector 208 can also be included at a distal end of the shaft 206 to allow a pull cable 106 to be connected thereto. In various embodiments, a spring 210 is included within the tubular body extension 204 or within the housing 202 and is configured to exert a rearward force on the shaft 206 toward the housing 202. The spring 210 may be a compression spring that is compressed when the shaft 206 is displaced in a direction away from the housing 202, for example, as is shown in FIG. 2. Such displacement may occur during a cable pull event. In other embodiments, the spring 210 may be an extension spring and may be configured to extend when the shaft 206 is displaced in a direction away from the housing 202. Other spring types and configurations may be possible.

The cable pull switch 200 can include a sensor 212, and in some embodiments, can also include a processing device 214, a communication module 216, an indicator 218, and/or an emergency stop ("e-stop") actuator 220. In various embodiments, the sensor 212 is a polychotomous sensor, in that the sensor 212 provides a variable output reading that is not limited to a binary on/off or open/closed state (e.g., unlike a contact switch, which can only provide an open or closed output). The output of the polychotomous sensor 212 may be digital or analog, and may include a plurality of possible values (possible near infinite output values if analog). The polychotomous sensor 212 may output one of the plurality of possible values dependent upon the sensed condition, which output value may be always available (e.g., when operating), continuously updated, or only available or updated upon request (e.g., a request from processing device 214 or another processing device). In various embodiments, the sensor 212 is an electrical sensor and may include various circuitry elements and modules to affect its particular sensing mechanism. Examples of polychotomous sensors 212 include, but are not limited to, strain gauges, linear optical sensor arrays, or inductance sensors, all of which are discussed in greater detail below. Still further examples may include Hall effect sensors, proximity sensors, potentiometric position sensors, capacitive position sensors, linear voltage differential transformers, magnetostrictive linear position sensors, eddy current-based position sensors, fiber-optic position sensors, rotary encoders, incremental encoders, wire draw encoders, gravimeter sensors, gyroscopic sensors, impact sensors, inclinometers, laser rangefinder sensors, selsyn sensors, shock detectors, tilt sensors, ultrasonic thickness gauges, variable reluctance sensors, bhangmeter sensors, hydrometer sensors, force sensors, level sensors, load cells, magnetic level gauges, nuclear density gauges, piezoelectric sensors, torque sensors, viscometer sensors, and other known and unknown sensing devices that are capable of outputting a plurality of sensor values corresponding to a measurement of a strain, a stress, a tension, a location, a velocity, an acceleration, a change in a condition, or other measurable conditions. The polychotomous sensor 212 may be configured to output an absolute value (e.g., an actual position of one element compared to another, or a measured value of a strain exerted on an object, etc.) or an incremental value (e.g., a position relative to an end stop position or relative to a position at startup, etc.).

The processing device 214 may communicate with the sensor 212 and/or the communication module 216 via any known communication protocol. Alternatively, either or both of the sensor 212 and the communication module 216 may be integral with the processing device 214. The processing device 214 may comprise one or more microprocessors, microcontrollers, Field-Programmable Gate Arrays (FPGA), Application-Specific Integrated Circuits (ASIC), Digital Signal Processors (DSP), Peripheral Interface Controllers (PIC) processors, or other known processing device types or combinations thereof. The processing device 214 may, in certain embodiments, include or be coupled to memory devices as are known in the art. The processing device 214 may be configured to execute code (e.g., firmware or software) that may be stored therein or stored on a separate communicatively coupled memory device. The code may be loaded for the processing device 214 to execute through the communication module 216 (e.g., at manufacture time or during an upgrade), or may be preloaded during manufacture and/or assembly through another process. The communication module 216 (whether a separate module or integral with the processing device 214) is configured to output one or more signals (e.g., an Output Signal Switching Device signal ("OSSD")) through a communication port 222. The output signal may be coupled to one or more communication relays or other devices to effect control of an associated machine, particularly to shut the machine off or enter a safe mode in the event that the output signal indicates a trigger condition has occurred (e.g., a cable pull event). The communication module 216 may also receive inbound communications from other sources (e.g., from a network of devices or from the associated machine). Alternatively, in the absence of a processing device 214, the cable pull switch 200 may provide the sensor values from the sensor 212 to the output port 222 in a known manner so that a separate communicatively linked device can receive the sensor values and make decisions based thereon. In such an approach, the communication module 216 or a different processing device may be included, for example, a less powerful microprocessor, to effect communication through the port 222 of the sensor values.

In some embodiments, the cable pull switch 200 includes the e-stop actuator 220, which may be, for example, a highly-visible button located on an accessible surface (e.g., top surface) of the housing 202 such that the actuator 220 can be easily depressed. The e-stop actuator 220 may utilize the same technologies described herein (for sensing a cable pull event through the shaft 206) to sense an actuation or depression of the actuator 220, or the actuator 220 may use different technology (e.g., more primitive contact-based switching) to sense actuation. In some embodiments, the e-stop actuator 220 is communicatively coupled to the processing device 214 and, upon actuation, will affect an output signal through the port 222 indicative of its actuation to affect stoppage of the associated machinery or to serve another function. The output function of the e-stop actuator 220 may serve the same function as that of the cable pull sensing function (e.g., to stop an associated machine), or may be a different function altogether (e.g., to stop a different machine).

Figure 3:
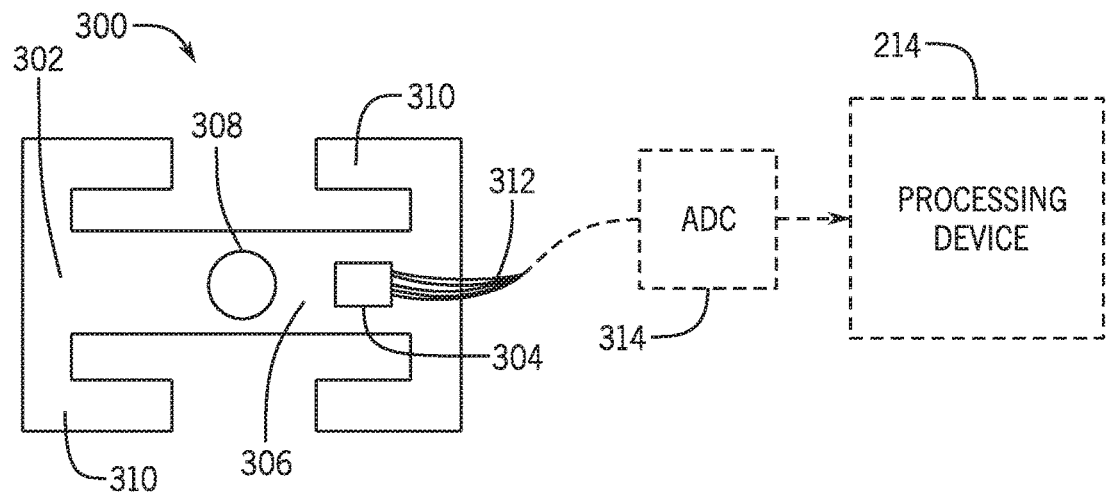
FIG. 3 shows an example strain gauge assembly as an example of a polychotomous sensor in accordance with various embodiments.
Figure 4A:
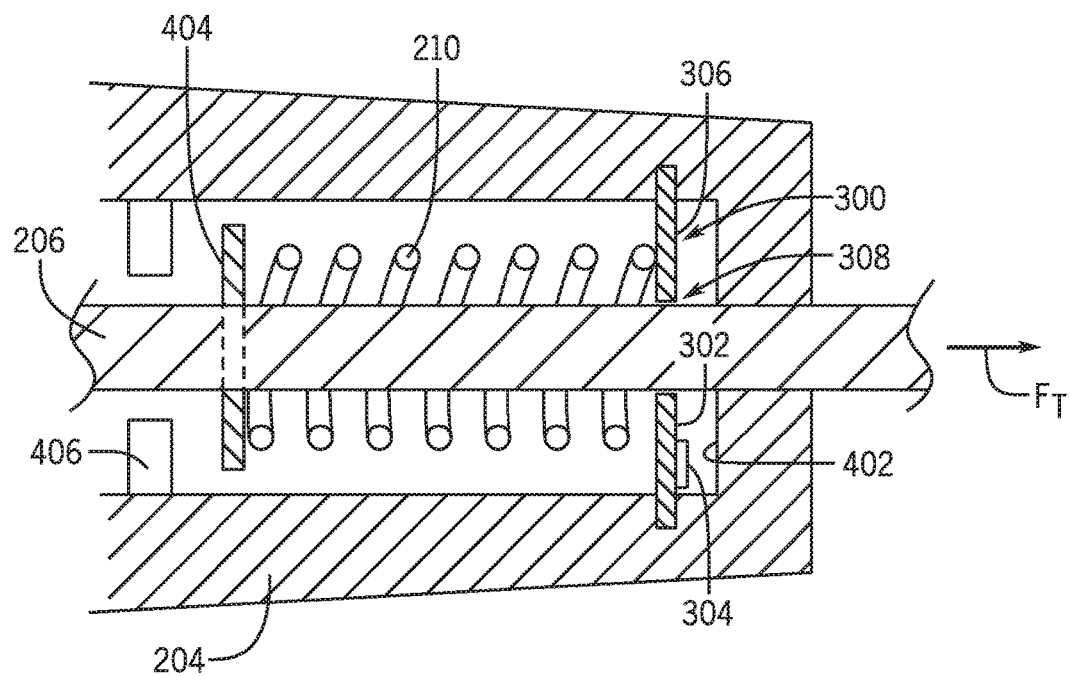
FIGS. 4A and 4B show example implementations of a polychotomous sensor usable with the cable pull switch of FIG. 2 in accordance with various embodiments.

Turning now to FIGS. 3 and 4A, an example implementation of a polychotomous sensor 212 within the cable pull switch 200 is illustrated in accordance with various embodiments. In this approach, a strain gauge assembly 300 includes a substrate 302 and a strain gauge 304 bonded to a surface of the substrate 302. The substrate 302 may be formed of metal (e.g., steel), though other rigid materials may be utilized. The substrate 302 may include a member 306 configured to receive stresses. The member 306 may also include one or more holes 308 and/or one or more tabs 310 to allow attachment to other elements. The strain gauge 304 may be a known type of strain gauge (e.g., using a metallic foil pattern, a semiconductor strain gauge, or other known and currently unknown strain gauge types) which may utilize a traditional Wheatstone bridge (or other known or currently unknown circuit designs) to implement an output reading. The strain gauge 304 may be bonded to a surface of the substrate 302 through any known mechanical bonding technique, including but not limited to adhesives (e.g., epoxy) or thermal bonding. Many variations are possible as to the design and implementation of the strain gauge 304 and the substrate 302 and may be application specific.

The strain gauge 304 may include electrical wiring 312 to output a sensed value. For example, the strain gauge 304 may output or make available a value of an electrical resistance through the strain gauge 304. This value can be coupled, via the electrical wiring 312, to an analog-to-digital converter (ADC) 314 which may be separate from or integral with the processing device 214. The ADC 314 may convert a reading of the electrical resistance through the strain gauge 304 into a digital value for use by the processing device 214 or another device. For example, the ADC 314 (or another device) may effect a voltage or current to flow through the strain gauge 314 and a value of the electrical resistance can be determined by reading a corresponding current or voltage output (e.g., according to the equation V=I*R or another variation, where V is the voltage, I is the current, and R is the resistance). Alternatively, the strain gauge 304 itself may be configured to output a digital value of the electrical resistance by an incorporated ADC within the strain gauge 304.

As a force or stress (e.g., a bending stress) is exerted upon the member 306 of the substrate 302, the member 306 will flex slightly in proportion to the amount of stress exerted. In accordance with various embodiments, this slight flexing causes a corresponding and proportional flexing in traces of a resistive circuit within the strain gauge 304, which in turn alters a value of the electrical resistance there through. The value of this electrical resistance is therefore related to and proportionate to the amount of stress exerted upon the member 306 of the substrate 302.

Figure 4B:
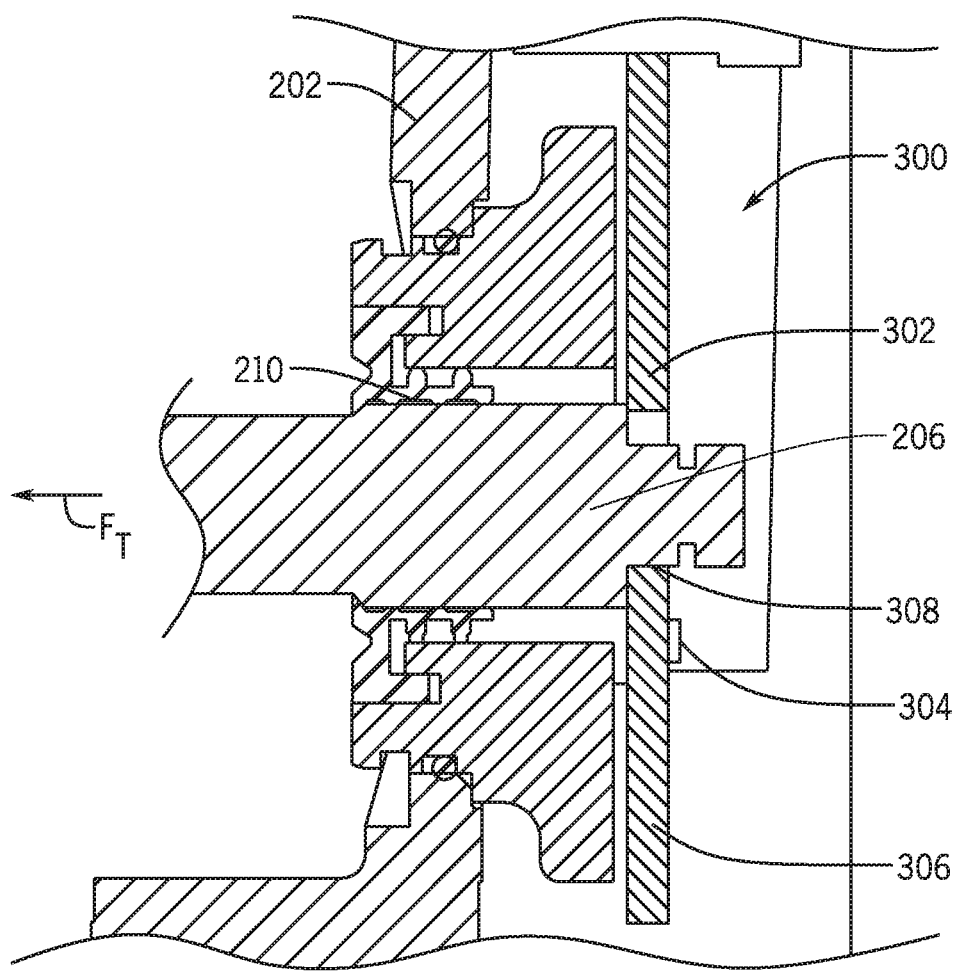

Turning now to FIG. 4A, an example implementation of the strain gauge assembly 300 with the cable pull switch 200 is illustrated in accordance with various embodiments. In one approach, the strain gauge assembly 300 can be located within the tubular body extension 204 (e.g., with notches or ridges formed therein, or the like) such that the shaft 206 passes through the hole 308 of the substrate 302. Other arrangements and/or configurations are possible, such as where the tubular body extension 204 is eliminated or reduced in size such that the spring 210 is at least partially external to the housing 202 (see FIG. 4B). In this arrangement, the spring 210 can be at least partially or completely free of mechanical interference with the tubular body extension 204. The member 306 of the substrate 302 is free from mechanical interference from adjacent side walls (e.g., the front wall surface 402) such that it is allowed to flex. Wiring 312 (not shown in FIGS. 4A and 4B) can be routed from the strain gauge 304 to a processing device 214 or other element. A stop element 404 (e.g., a ring or pin) can be secured to or integrally formed with the shaft 206. In one embodiment, the stop element 404 (or another feature of the shaft 206) may engage a rear backstop 406 in the absence of a tension force (FT) that exceeds the force exerted by the spring 210. By this, the rear backstop 406 dictates a fully contracted resting position of the shaft 206. Other positions and/or configurations are possible for the rear backstop 406.

The spring 210 (here, a compression spring) is compressed between the stop element 404 and the member 306 of the substrate 302 of the strain gauge assembly 300. In this manner, a tension force (FT) exerted on the shaft 206 in the longitudinal direction (indicated by the arrow FT) by tension from the pull cable 106 will compress the spring 210, thereby exerting a stress on the substrate 302. As the shaft moves further outward (e.g., by a cable pull event or by increased tension adjustment of the pull cable 106), the spring 210 is compressed further, which increases the force exerted by the spring 210 on the substrate 302 resulting in increased stress exerted on the substrate 302. This stress exerted on the substrate 302 by spring 210 is directly related to the displacement of the shaft 206 (i.e., in a non-moving state) by Hooke's Law (F=−k*X, where F is the force exerted by the spring 210, k is the spring constant of the spring 210, and X is the displacement (e.g., compression) of the spring 210 from its non-compressed resting position). By measuring the stress in the substrate 302 with the strain gauge 304, and with the knowledge of other variables (e.g., the designed spring constant k of the spring 210), the displacement distance of the shaft 206 can be determined. This calculated displacement distance, or, alternatively, the measured stress value itself, can be used to detect a cable pull event, a cable slack event, or to determine a proper adjustment tension (e.g., during installation and/or maintenance adjustment).

Other variations are possible for the placement of the strain gauge assembly 300 and/or its interaction with spring 210 or a different spring (e.g., an extension spring or a spring purposed solely for sensing purposes) or with the shaft 206 itself. For example, the strain gauge assembly 300 and/or the spring 210 (or a different spring) may be placed within the housing 202 rather than within the tubular body extension 204. Further, many variations on the design of the substrate 302 and its interaction with the spring 210 and/or shaft 206 may be possible and are contemplated by this disclosure.

Figure 5:
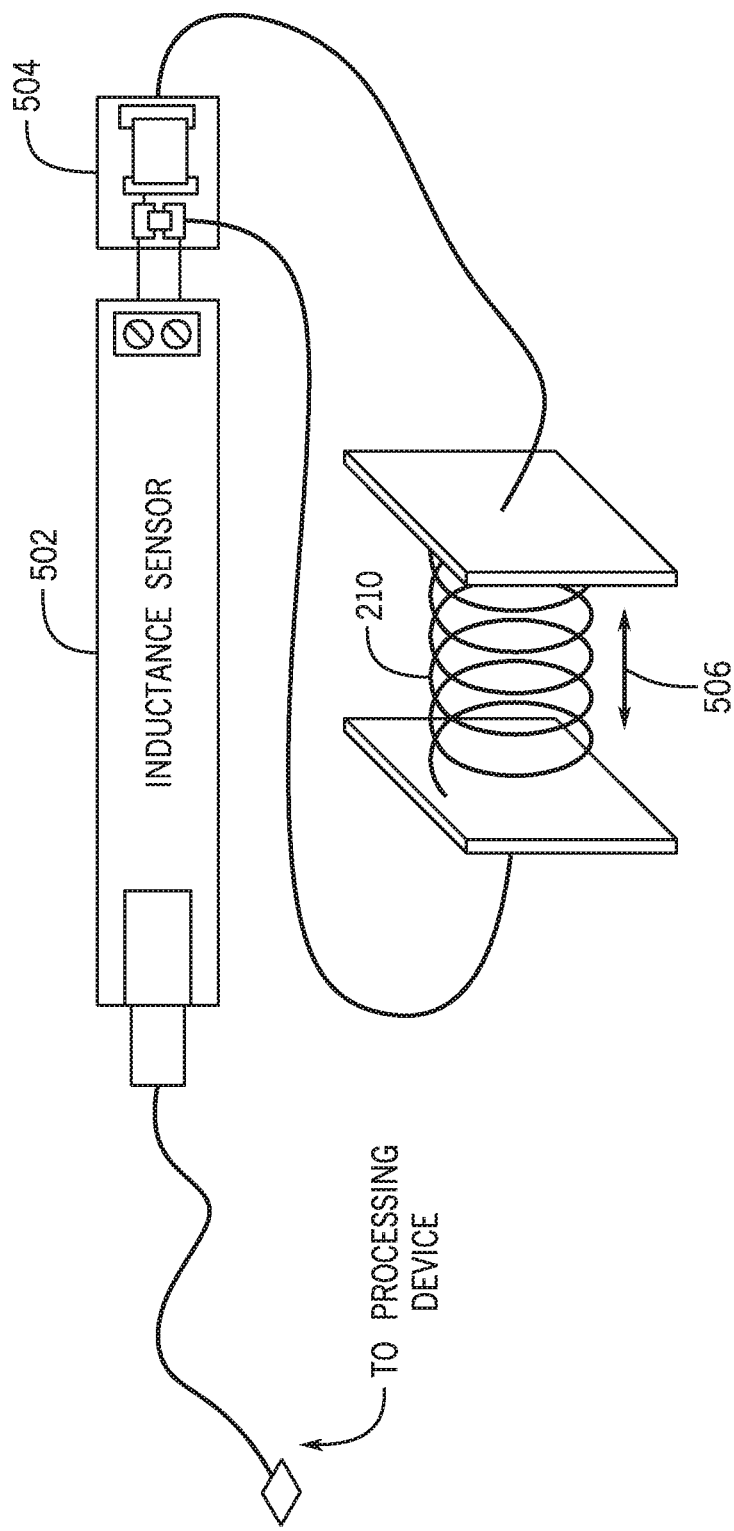
FIG. 5 shows an example inductance sensor as an example of a polychotomous sensor in accordance with various embodiments.

Turning now to FIG. 5, a different implementation of a polychotomous sensor 212 is illustrated in accordance with various embodiments. FIG. 5 illustrates a conceptual implementation of an inductance sensor 502 in accordance with various embodiments. The inductance sensor 502 is connected to the spring 210 (or another spring), possibly through various interceding and/or conditioning circuitry elements 504 as may be appropriate in a given application setting. For example, two leads are provided from the inductance sensor 502 and/or circuitry elements 504, one lead is electrically connected to a first end of the spring 210 (e.g., a coil spring), and the second lead is electrically connected to a second end of the spring 210. The inductance sensor 502 can then measure an inductance of the spring 210. As the spring is compressed or expanded (shown by arrow 506), the inductance of the spring 210 can change, and the inductance sensor 502 can sense and measure those changes. One example of an inductance sensor 502 may include a LDC1000 manufactured by Texas Instruments® of Dallas, Tex.

The electrical inductance of the spring 210 may be proportional to the compression distance of the spring 210, which compression distance is directly proportional to the displacement distance of the shaft 206. As such, the inductance sensor 502 can measure the electrical inductance within the spring 210 and a processing device 214 (or another device) can convert that electrical inductance value into a displacement distance and/or a tension force value.

Figure 6:
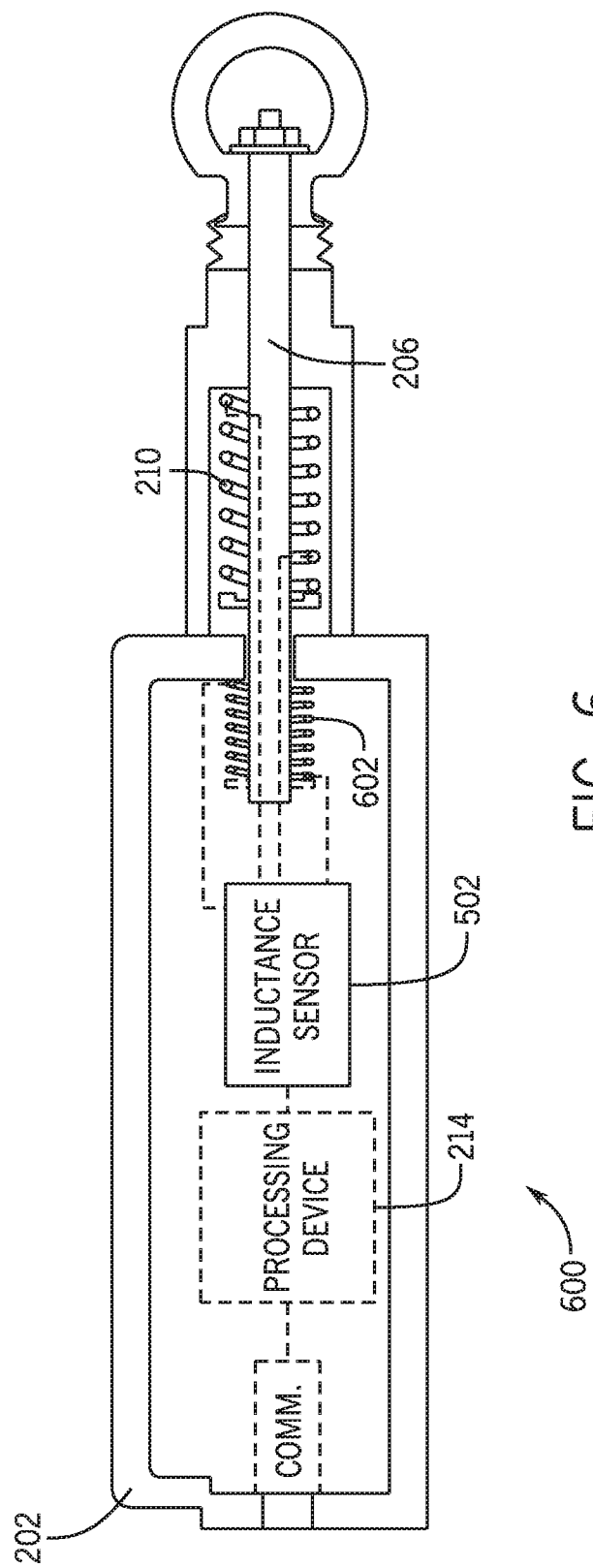
FIG. 6 shows another example implementation of a polychotomous sensor usable with the cable pull switch of FIG. 2 in accordance with various embodiments.

Turning to FIG. 6, an example cable pull switch 600 incorporating the inductive sensor 502 is illustrated in accordance with various embodiments. The inductance sensor 502 may be electrically coupled to the ends of the spring 210 through leads (shown in dashed line passing through the shaft 206, however their actual routes through the assembly may be different). In this approach, the inductance sensor 502 can measure the inductance through the spring 210 operating as a main tensioning spring. Alternatively, and in accordance with a different embodiment, a second spring 602 different from the spring 210 could be provided elsewhere (e.g., within the housing 202) such that the second spring 602 is compressed and/or expanded in relation to the displacement of the shaft 206. Each end of the second spring 602 could be connected to the inductive sensor 502 and the value of the electrical inductance through the second spring 602 could be used to determine a shaft displacement distance and/or tension.

Accordingly, the processing device 214 can monitor the present displacement distance of the shaft 206 and any changes in that displacement distance via the inductance sensor 502 in order to detect a cable pull event, a cable slack event, or to aid in tensioning adjustments. Similarly, an inductance sensor 502 could be utilized with the e-stop actuator 220 to detect a depressed distance of the actuator 220 to detect its actuation.

Figure 7:
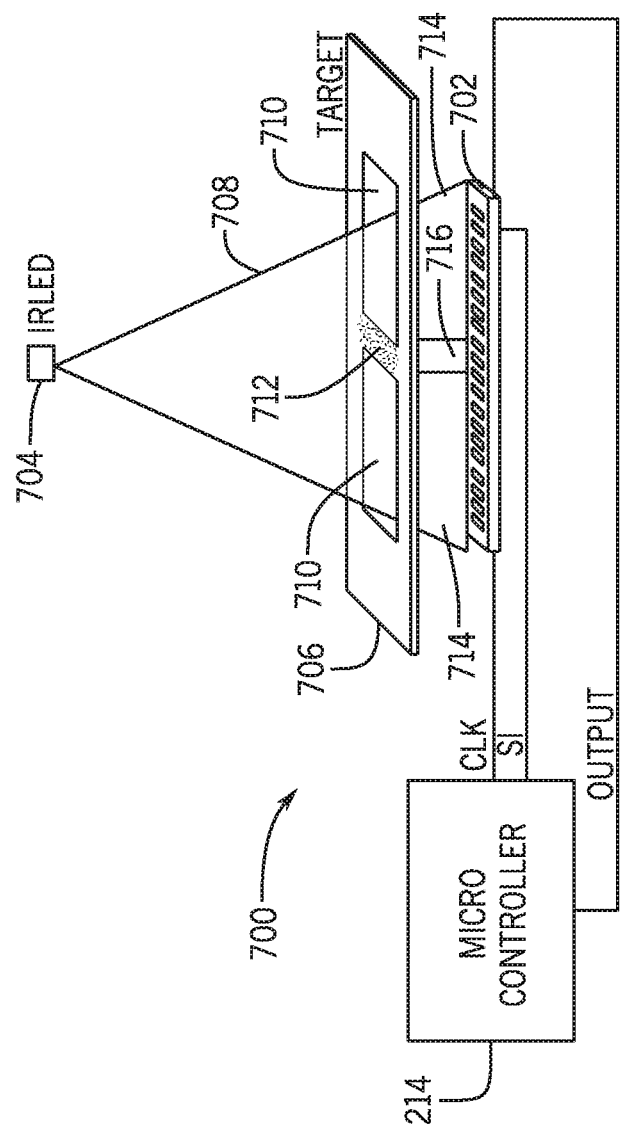
FIG. 7 shows an example linear optical sensor assembly as an example of a polychotomous sensor in accordance with various embodiments.

Turning now to FIG. 7, a different implementation of a polychotomous sensor 212 is illustrated in accordance with various embodiments. FIG. 7 illustrates a conceptual implementation of linear optical sensor assembly 700 in accordance with various embodiments. The linear optical sensor assembly 700 includes a linear optical sensor 702, an illuminator (e.g., an infra-red light emitting diode (IR LED) 704, and a movable target 706. The linear optical sensor array 702 (and the IR LED 704) can be electrically coupled to the processing device 214 to control operations thereof and to receive optical position readings therefrom. In various approaches, a clock signal (CLK) and a serial input signal (SI) (to initiate data readout) may be provided from the processing device 214 to the linear optical sensor array 702 and an analog or digital output signal from the linear optical sensor array 702 may be coupled back to the processing device 214 or to an interceding ADC, if required (not shown). In operation, and in accordance with various embodiments, the IR LED 704 provides light 708 to illuminate a sensor surface the sensor array 702 including a plurality of individual photodiode sensors. The target 706 may include one or more apertures 710 and/or light blocking elements 712. Light passes through the apertures 710 and onto illuminated portions 714 of the sensor surface of the sensor array 702, while other shaded portions 716 of the sensor surface are shaded from the light 708 by the light blocking elements 712. In this manner, a location of the target 706 relative to the linear optical sensor array 702 can be determined based on the encoded pattern of light 714 and shade 716 sensed by the individual photodiodes of the sensor array 702.

Other variations are possible for the optical sensor assembly 300. For example, instead of apertures 710 and light blocking elements 712, reflective and non-reflective surfaces can be used. Many other known configurations are possible and are contemplated by this disclosure. Additionally, the target 706 can include an encoded pattern that is absolute or incremental, though an absolute position encoded pattern may be beneficial in many application settings (e.g., to reduce the need for or eliminate a calibration step upon power up).

Figure 8:
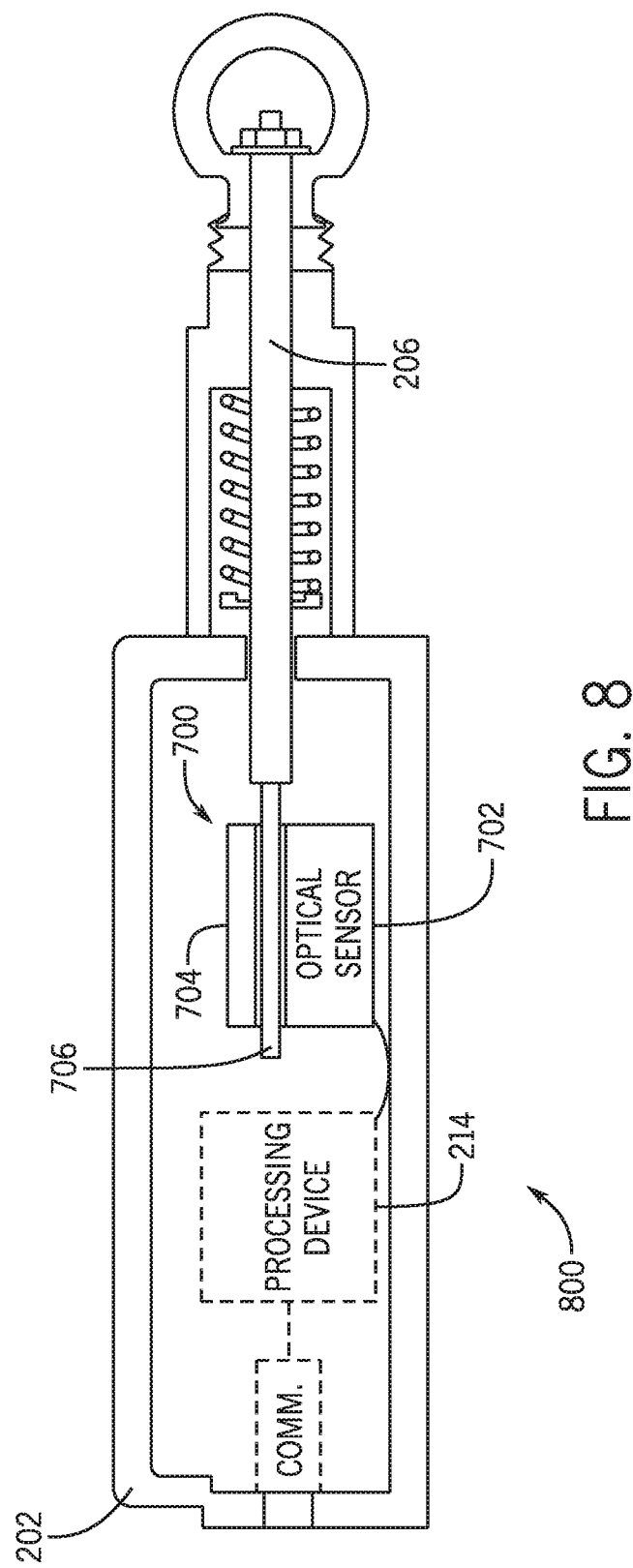
FIG. 8 shows another example implementation of a polychotomous sensor usable with the cable pull switch of FIG. 2 in accordance with various embodiments.

Turning to FIG. 8, an example cable pull switch 800 incorporating the linear optical sensor assembly 700 is illustrated in accordance with various embodiments. The linear optical sensor assembly 700 may be included within the housing 202 of the cable pull switch 800. The target 706 may be coupled directly (as shown) or indirectly to the shaft 206 such that linear movement of the shaft 206 corresponds to linear movement of the target 706. The light pattern created by the target 706 and illuminated onto the sensor surface of the optical sensor array 702 provides information as to the present displacement distance of the shaft 206. The optical sensor array 702 can in turn provide the sensed optical position data to the processing device 214, which can in turn determine the present displacement distance of the shaft 206. As the target 706 moves in connection with movement of the shaft 206, the light pattern illuminated on the sensor surface of the optical sensor array 702 will change and the corresponding optical position data will change.

Accordingly, the processing device 214 can monitor the present displacement distance of the shaft 206 and any changes in that displacement distance via the linear optical sensor assembly 300 in order to detect a cable pull event, a cable slack event, or to aid in tensioning adjustments. Similarly, a linear optical sensor assembly 300 could be utilized with the e-stop actuator 220 to detect a depressed distance of the actuator 220 to detect its actuation.

In various ones of the above embodiments (e.g., the strain gauge embodiment, the inductance sensor embodiment, and/or the optical light sensor array embodiment) or other possible embodiments, the particular sensor 212 type used may be an absolute sensor or an incremental sensor. In either approach, it may be beneficial to calibrate the readings from the sensor 212. For example, springs 210 and or sensors 212 may have tolerances in their initial manufacturing such that calibration could help ensure proper correlation of values to positions and/or tension amounts. If a strain gauge assembly 300 is used, an initial strain value reading could be taken during assembly of the strain exerted on the substrate 302 by the spring 210 when the shaft 206 is in its fully contracted resting position. Optionally, a second strain value reading could be taken at a known and controlled displacement distance, while additional different readings could be taken in a similar manner as well. A correlation could be made between the recorded strain value(s) and the displacement distance(s) (e.g., zero and/or another known displacement distance) to calibrate the cable pull switch 200. The calibration reading(s) could also be made periodically or with every power-up to account for any deterioration or change in the strength of the spring 210 and/or the substrate 302 (e.g., due to use over time and/or due to thermal changes) or other factors.

Similarly, if an inductance sensor 502 is used, an initial inductance value reading could be taken when assembled or when installed at one or more known displacement positions to calibrate the cable pull switch 200. Again, these calibration readings could be repeated periodically as well.

If a linear optical sensor assembly 700 is used, initial optical position value readings could be taken when assembled or when installed at one or more known displacement positions to calibrate the cable pulls switch 200. However, the variations of a linear optical sensor array 702 and/or a moving target within the cable pull switch 200 may be much more controllable. As such, variations in the optical position value readings may be negligible so as to negate the need for calibration. Alternatively, a single optical position value reading can be made while the shaft 206 is in the fully contracted resting position, which could be used as the zero-displacement point and could be used whether the linear optical sensor assembly 700 is an absolute position sensor or an incremental position sensor.

Additionally still, these disclosed embodiments may enable calibration of the system as a whole to account for variations in, for example, the spring 210. A calibration step could be utilized during assembly to exert a calibrated tension force (FT) (e.g., an ideal center tension force) on the shaft 206, wherein the particular sensor 212 used can record that value (e.g., measured strain/tension and/or displacement distance) as a calibrated value for the ideal center tension force.

These are but a few examples of implementation of polychotomous sensor types within a cable pull switch 200. Many other sensor types may be utilized that provide data or readings beyond the simple on/off or open/closed status of contact switches. As is made apparent, the versatility of a polychotomous sensor and the additional data it provides can be useful to implement a bevy of features and/or improvements.

Figure 9:
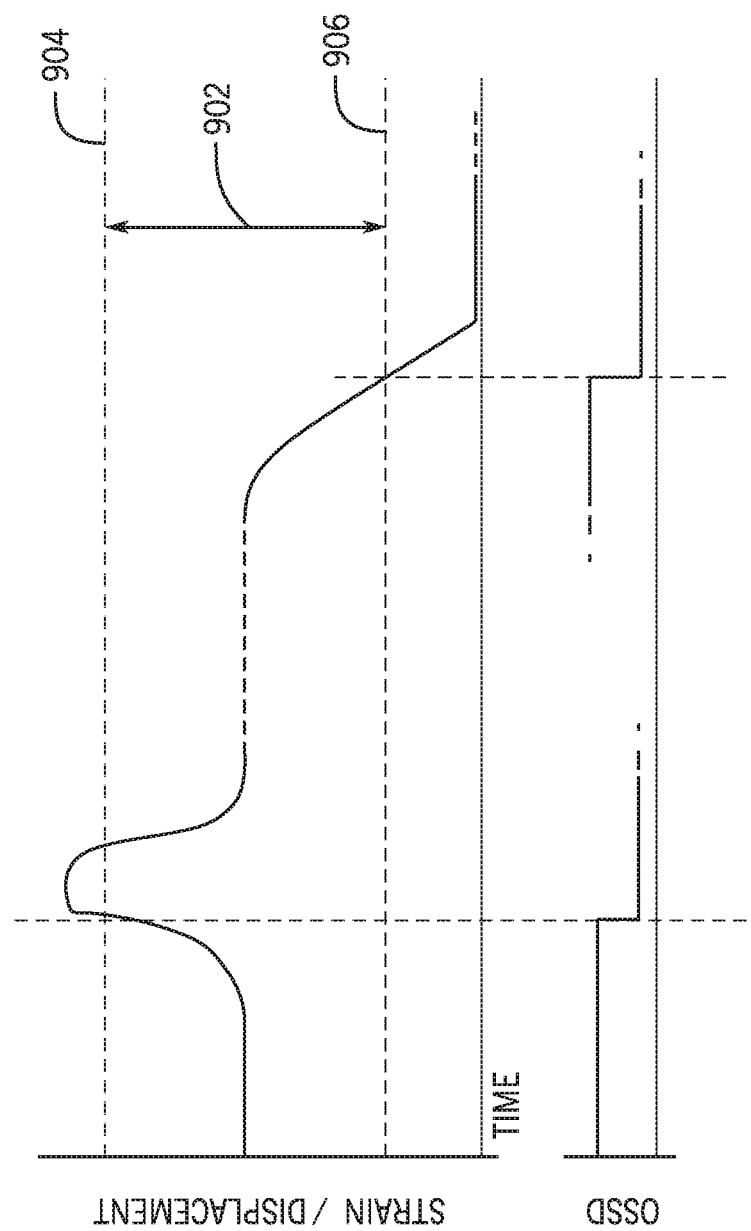
FIG. 9 illustrates various operational aspects of the cable pull switch of FIG. 2 in accordance with various embodiments.

Turning now to FIG. 9, various operational aspects of the improved cable pull switch 200 are illustrated in accordance with various embodiments. Shown here is a graph of a sensed value (Y-axis) over time (X-axis). The sensed value may be a strain value (e.g., corresponding to a tension force FT exerted on the cable pull switch) or a displacement value (e.g., corresponding to the displacement distance of the shaft 206). For example, the sensed value may be a value of the electrical resistance through a strain gauge 304, which corresponds to a strain or tension exerted by the pull cable 106. The sensed value may be a value of the electrical inductance as measured by an inductance sensor 502, which may correspond to a displacement distance of the end of the pull cable 106. Similarly, the sensed value may be a value of displacement from a linear optical sensor array 702, which may correspond to a displacement distance of the end of the pull cable 106. In various embodiments, the values (e.g., strain/tension and/or displacement distance) may be proportional (e.g., linearly proportionate), for example, according to Hooke's law for springs.

A non-tripped value window 902 is illustrated including a pull threshold value 904 defining a first side of the window 902 and a slack threshold value 906 defining a second side of the window 902. When the value of the tension or displacement is within the non-tripped value window 902 (e.g., after a reset or initialization), the cable pull switch 200 effects an output indicative of a non-tripped condition. Here, as is shown initially, an Output Signal Switching Device (OSSD) output (e.g., as may be output from the cable pull switch 200 via the port 222) is high when the sensed value is within the non-tripped value window 902, indicating an absence of a trip condition (e.g., the absence of a cable pull event or a slack event).

The sensed value may be relatively steady and unchanging at a set tension or displacement distance (e.g., corresponding to the set tension for the system). However, upon a cable pull event, the tension and/or displacement distance may increase, typically rapidly, as a user grabs and yanks on the pull cable 106. This is illustrated as the upward spike in tension or displacement. As the tension or displacement increases, it will exceed the pull threshold value 904 such that the sensed value is outside of the non-tripped value window 902 on its first side (e.g., exceeds the pull threshold value 904). At this point, a processing device 214 will determine the occurrence of a cable pull event and will generate an output signal indicative of the same. As is shown here, the OSSD signal goes from a high state to a low state, indicating a cable pull event.

FIG. 9 also illustrates a cable slack event. After the occurrence of the cable pull event, a reset may take place to reset the OSSD signal to a non-tripped high state (though, a cable slack event can occur at any time). A cable slack event may occur, for example, in an instance where the pull cable 106 may be cut, a cable clamp 122 may have slipped, a cable tensioner 108 may have failed, or thermal expansion caused the pull cable 106 to expand such that the tension or displacement dropped below a slack threshold value 906. In such an instance, the sensed tension or displacement value may fall below the slack threshold value 906 such that the sensed value is outside of the non-tripped value window 902 on its second side. At this point, the processing device 214 can determine the occurrence of a cable slack event and can generate an output signal indicative of the same. As is shown here, the OSSD signal goes from a high state to a low state, indicating a cable slack event.

Many other variations are possible. For example, separate or multiple output signals may be provided for each condition and additional data may be output as to, for example, the highest/lowest sensed value, a rate of change of the value, or other data. This data may be used by, for example, a system management computer or other device. Also, although the pull threshold value 904 is shown as greater than the slack threshold value 906 (as would correspond to actual tensions on the pull cable 106 or displacement distance of the shaft 206), various polychotomous sensors 214 may be configured so that increasing tension on the pull cable 106 results in a decreased sensed value. In such a reversed approach, the first side of the non-tripped value window 902 would be the lower end defined by the pull threshold value 904 and the second side of the non-tripped value window 904 would be the upper end and defined by the slack threshold value 906.

Figure 10:
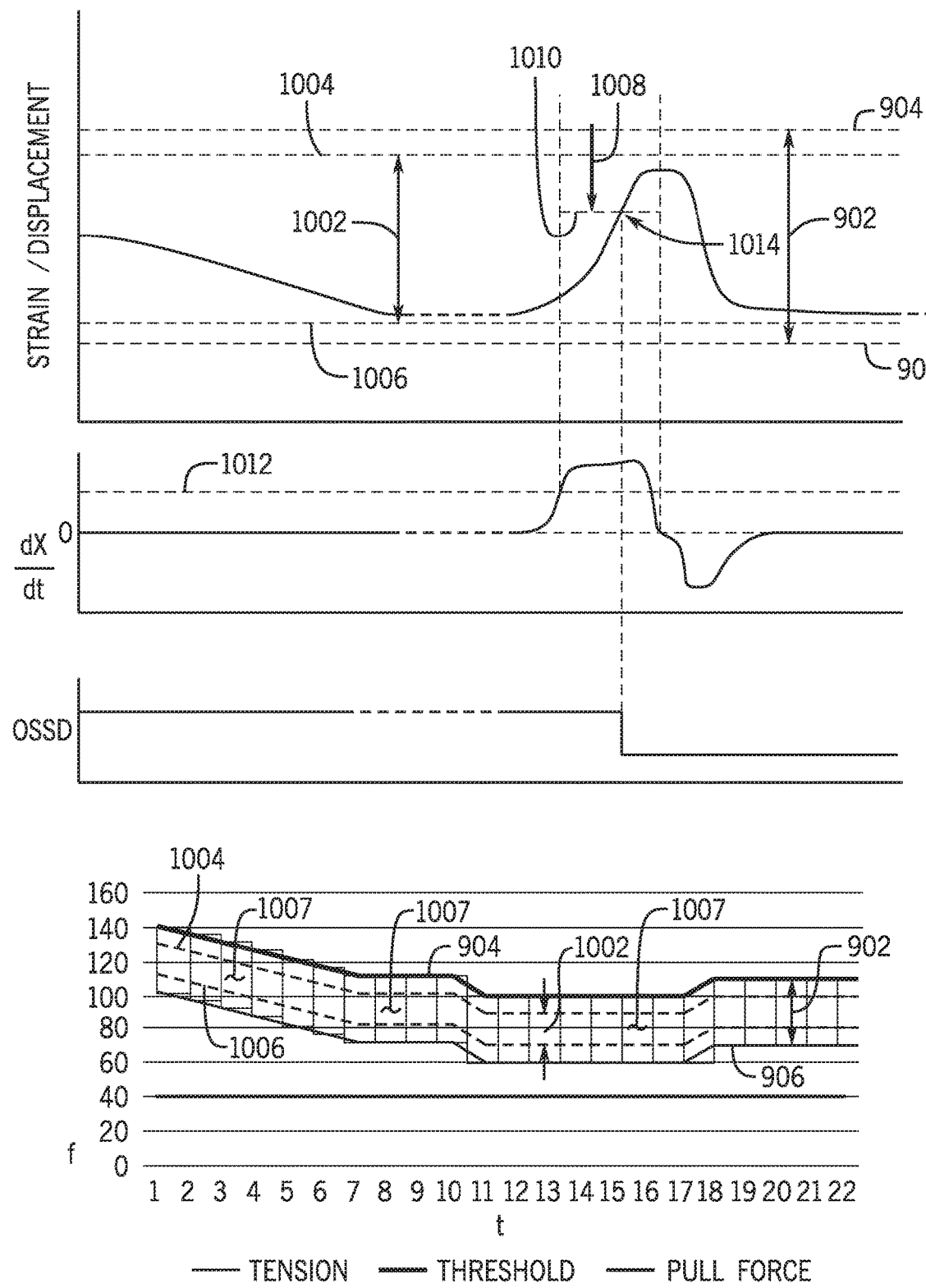
FIG. 10 illustrates various other operational features of the cable pull switch of FIG. 2 in accordance with various embodiments.

Turning now to FIG. 10, optional features of the cable pull switch 200 are illustrated in accordance with various embodiments. Like the non-tripped value window 902 (also shown in FIG. 10), an adjustment value window 1002 may also exist. This adjustment value window 1002 may be narrower than the non-tripped value window 902 and may be defined on a first side by a pull adjustment margin threshold value 1004 representing a value that is within the non-tripped value window 902 by a margin from the pull threshold value 904. For example, in a configuration where the pull threshold value 904 is greater than the slack threshold value 906 (as is shown in FIGS. 9 and 10), the pull adjustment margin threshold value 1004 is an upper pull adjustment margin threshold value 1004 and is less than the pull threshold value 904. Similarly, the adjustment value window 1002 may be defined on a second side by a slack adjustment margin threshold value 1006 representing a value that is within the non-tripped value window 902 by a margin from the slack threshold value 906. As is shown in FIG. 10, the slack adjustment margin threshold value 1006 is a lower slack adjustment margin threshold value 1006 and is greater than the slack threshold value 906. The adjustment value window 1002 may be useful, for example, during tension adjustment of the pull cable 106 (e.g., during installation and/or maintenance) to provide a narrower window in which the tension of the pull cable 106 should be adjusted to keep the normal operation tension of the pull cable 106 closer to an ideal tension that is away from the edges of the non-tripped value window 902. Additionally, if the tension of pull cable 106 approaches the pull adjustment margin threshold value 1004 or the slack adjustment margin threshold value 1006, the indicator 218 (see FIG. 2) may be triggered to provide a visual or audible notification that the tension of pull cable 106 requires adjustment.

However, a situation may occur in normal use where thermal expansion causes the pull cable 106 to heat up and expand (e.g., in a warm environment, in use outdoors, etc.). If the tension of the pull cable 106 is adjusted while the cable is cool, as the cable heats up, it will expand slowly so as to reduce the tension and/or displacement at the cable pull switch 200. This is illustrated in the first portion (left portion) of FIG. 10, where the strain or displacement slowly drops. This first portion of FIG. 10 is shown compressed over time and the actual expansion of the cable may take many minutes or hours. After a time, the tension and/or displacement at the cable pull switch 200 may be near or below the lower slack adjustment margin threshold 1006. If the tension/displacement stays within the adjustment value window 1002, no alarm or warning should be issued. However, in certain embodiments, if the tension/displacement exits the adjustment value window 1002 (e.g., by dropping below the lower slack adjustment margin threshold 1006), an alarm or warning may be effected indicating adjustment may be required, however normal operation of associated machinery may continue in some embodiments. If the tension/displacement drops low enough to exit the non-tripped value window 902 (e.g., by dropping below the slack threshold value 906), a cable slack event would be detected and an appropriate output signal could be effected indicating the same, at which point associated machinery could be stopped. Similarly, if tension of the pull cable 106 was adjusted while it was warm, as the pull cable 106 cools it will contract and could cause a similar problem by increasing the tension or displacement, possibly causing an artificial trip situation on the upper end.

These artificial trip situations could cause frustration and reduce operating efficiency of a manufacturing plant or factory (e.g., by creating unnecessary down-time on a line). Further, it could cause operators to implement work-arounds to avoid these artificial trip situations (for example, by wrapping the pull cable around a near eyelet) to avoid thermal expansion/contraction from falsely tripping the cable pull switch 200. These work-arounds could eviscerate the purpose of the cable pull switch 200. Accordingly, to avoid frustration, reduce down-time, and avoid unsafe work-arounds, various measures can be implemented that take advantage of the extra data provided by the polychotomous sensor 212.

In one embodiment, the cable pull switch 200 may determine a rate of change (e.g., a first order derivative) of the strain or displacement. This rate of change is shown as dX/dt in FIG. 10, where X is either displacement distance or strain/tension and where t is time. The rate of change may correspond to velocity, in some embodiments. In one embodiment, if the rate of change is slow enough (e.g., below a threshold rate of change value), the processing device 214 in the cable pull switch 200 may periodically adjust one or more of the threshold values at a fixed interval according to a present value of the sensed value (e.g., strain/tension or displacement distance). For example, the threshold rate of change value can be about 10N to about 90N over a time period. In one embodiment, the time period can be one second; however, the time period can be more than one second (e.g. one minute, one hour, etc.). Alternatively, the time period can be less than one second (e.g., one millisecond, one nanosecond, etc.), or any other time period as applicable. In one specific embodiment, the threshold rate of change value can be 30N over a one second period.

The cable pull switch 200 can monitor the sensed value continuously or at predetermined timed intervals, and can adjust the threshold values to maintain a constant pull force regardless of changes in the sensed value so from a user perspective, the user does not have to apply a greater pull force to trip the switch 200 as heat, wear and natural stresses cause the cable tension to drop below an ideal tension over time. A floating window 1007 can be implemented in firmware in the cable pull switch 200 with the pull threshold value 904 and the slack threshold value 906 changing over time as microprocessor 214 can continuously measure the tension in the pull cable 106 and update the base tension of each window 1007 at a fixed interval of time. Gradual changes in tension can move the window up or down by adjusting the pull threshold values 904 and the slack threshold values 906, bounded by a minimum tension (as a non-limiting example 10N) and a maximum pulled tension (as a non-limiting example 180N). By implementing the floating windows 1007, the pull cable switch 200 can tolerate changes to the environment but it can still be triggered by a user.

For example, if thermal expansion were to reduce the strain/tension or displacement distance, and the rate of change was slow enough (e.g., minutes, hours, or possibly so slow as to be imperceptible) so as not to confuse the slow change in strain/tension or displacement distance with a fast change from a cable cut event or another cable failure, the cable pull switch 200 may lower the thresholds 904 and/or 906 defining the non-trip value window 902. Similarly, the system may lower the thresholds 1004 and/or 1006 defining the adjustment value window 1002. In some embodiments, the adjustment amount may be limited by an allowable adjustment amount (as non-limiting examples, +/−25%, +/−10 mm displacement distance, etc.) and/or an absolute lower or upper value (e.g., a lower slack threshold value 906 cannot be less than a 10 mm displacement distance, etc). By this, the cable pull switch can accommodate normal thermal expansion and contraction without falsely tripping the system, as long as the tension/displacement of the pull cable 106 remains within minimum safe operating conditions (e.g., not too much slack so that the shaft 106 is non-responsive to a cable pull event, and not too much tension/displacement so that a cable pull event would exceed the maximum tension or displacement sensing abilities of the cable pull switch 200). Further, in a similar manner as is discussed below, by lowering an upper pull threshold value 904 when thermal expansion occurs, the likelihood that the cable pull event is actually detected can increase.

With continued reference to FIG. 10, the right portion of the graph (after the dashed lines, which indicates passage of time) shows a cable pull event. Like in FIG. 9, a strain/tension or a displacement distance is increased sharply in response to a user pulling on the pull cable 106. If the pull cable 106 had expanded due to thermal expansion (so that the normal resting tension/displacement was low, possibly near or below a lower slack adjustment margin threshold value 1006), and if a user did not pull on the pull cable 106 with substantial force, a prior art cable pull switch 102 may not register the cable pull event as the force or distance may not be enough to enable the mechanical contacts of the switch to be thrown. A similar situation may occur if the pull threshold value 904 is not adjusted.

In accordance with one embodiment, the cable pull switch 200 (and particularly the processing device 214) may take the rate of change (dX/dt) of the sensed value into account when determining whether a cable pull event has occurred. In one approach, the cable pull switch 200 may adjust 1008 (e.g., lower) the cable pull value threshold 904 to a new (e.g., lower) cable pull value threshold 1010 if the rate of change of the sensed value exceeds a threshold rate of change value 1012. As is seen in FIG. 10, the rate of change dX/dt exceeded the rate of change threshold 1012 and the upper cable pull value threshold 904 was lowered to a new threshold value 1010. Once the measured strain/tension or displacement exceeded the new lowered threshold value 1010 at point 1014, a cable pull event was determined to have occurred and the OSSD outputs were changed to indicate the occurrence of the cable pull event.

In one embodiment, the new lowered threshold 1010 may remain in effect for as long as the rate of change dX/dt exceeds the rate of change threshold value 1012. In another embodiment, once the rate of change dX/dt exceeded the rate of change threshold value 1012, the new lowered threshold 1010 may remain in effect for a set period of time (e.g., 1 or 2 seconds, etc.), or, in an alternative embodiment, until the rate of change dX/dt became negative (as shown in FIG. 10, corresponding to a release of the pull cable 106). In another approach, a negative rate of change threshold value (not shown) may be the same value (e.g., but negative) or a different value than the rate of change threshold value 1012 according to the requirements of a particular application setting. In one approach, the rate of change may be an absolute value of the rate of change (e.g., |dX/dt|) so that a negative rate of change will also "exceed" the threshold 1012.

In another approach, the system may not adjust thresholds, but may simply look to the rate of change dX/dt to indicate the occurrence of a cable pull event. For example, the system may determine whether the rate of change exceeds the rate of change threshold value 1012 for a certain time period (e.g., 0.2 or 0.5 seconds, etc.), which may serve to filter out any unintended vibrations that may briefly increase the rate of change, while allowing a true cable pull event to be registered solely by the rate of change. Many other variations are possible.

Figure 11:
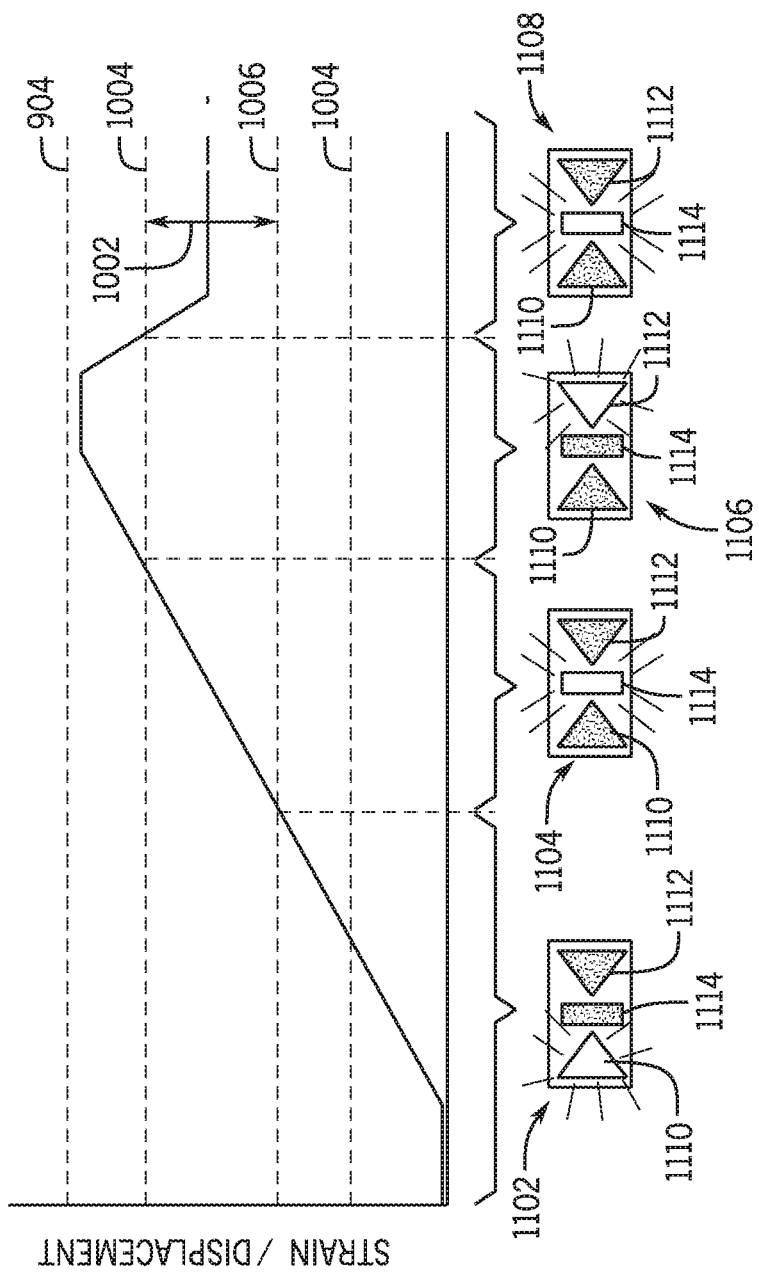
FIG. 11 illustrates yet other operational features of the cable pull switch of FIG. 2 in accordance with various embodiments.

Turning now to FIG. 11, another feature of the improved cable pull switch 200 is illustrated in accordance with various embodiments. During installation and/or maintenance, the tension/displacement of the pull cable 106 may be adjusted to be at a suitable tension/displacement. In one approach, an indicator 218 (see FIG. 2) is provided, for example, on the housing 202 of the cable pull switch 200. The indicator 218 may be an audible indicator (e.g., to emanate an audible tone) or a visual indicator. An example visual indicator is shown at 1102, 1104, 1106, and 1108, illustrating a single visual indicator at various times during installation/maintenance (reference is generally made to visual indicator 1102, but may pertain to all instances 1102, 1104, 1106, and 1108 of the visual indicator 1102). The visual indicator 1102 may include a first illuminator 1110 indicating a requirement to increase tension exerted on the pull cable 106, a second illuminator 1112 indicating a requirement to decrease the tension exerted on the pull cable 106, and, optionally, a third illuminator 1114 indicating the tension exerted on the pull cable 106 is acceptable. The illuminators 1110, 1112, and 1114 may be light emitting diodes (LEDs), though other illuminator types may be possible. The illuminators 1110, 1112, and 1114 may be differing colors according to different functions (e.g., red or yellow for the first illuminator 1110 and/or the second illuminator 1112, green or blue for the third illuminator 1114, though many other variations are possible). Further, in another embodiment, a single illuminator is used to convey through color (e.g., red for too much/too little tension, green for acceptable tension) and/or blinking rate (a slow blink rate when too much/too little tension and gradually speeding up to solid illumination when adjusted to an acceptable tension amount, or vise versa) to provide similar functionality and/or status information as is described below.

In operation, and in accordance with various embodiments, the visual indicator 1102 can provide an illuminated visual indication to provide a user with visual feedback of pull cable 106 tension during tension adjustment. In one embodiment, though not every embodiment, the cable pull switch may enter a tension adjustment state wherein the visual indicator 1102 is active. However, in other embodiments, the visual indicator 1102 may provide the disclosed functionality and status feedback whenever the cable pull switch 200 is powered without the need to enter a tension adjustment state.

In a first operational state, as is shown with visual indicator 1102, the tension/displacement is below the slack adjustment margin threshold value 1006. When in this state, the first illuminator 1110 may be illuminated (indicating a requirement to increase the tension) while the second illuminator 1112 and the third illuminator 1114 are dark. As the tension is increased and as the tension exceeds the slack adjustment margin threshold value 1006 such that it is within an acceptable range (e.g., within an adjustment value window 1002), the visual indicator enters a second operational state shown at 1104 wherein the third illuminator 1114 may be illuminated (indicating an acceptable tension) while the first illuminator 1110 and the second illuminator 1112 are dark. If the tension continues to increase and exceeds the upper pull adjustment margin threshold value 1004, the visual indicator enters a third operational state shown at 1106 wherein the second illuminator 1112 may be illuminated (indicating a requirement to decrease the tension) while the first illuminator 1110 and the third illuminator 1114 are dark. The installer can then lower the tension until the tension is back within the adjustment value window 1002, wherein the visual indicator re-enters the second operational state as is shown at 1108, which is identical to 1104. By this, an installer can be provided with a visual indication that is viewable from a distance (e.g., possibly up to 25-50 meters) so that as tension adjustments are made away from the ends of the pull cable 106 (for example, at a tensioner or a turnbuckle in the middle of the pull cable 106), the installer is not required to make multiple iterative trips back and forth between the cable pull switch 200 and the adjustment point on the cable 106, thereby saving time and improving convenience and usability of the cable pull switch 200.

Varying brightness and or blinking rates can be used with the multiple illuminators 1110, 1112, and 1114 to provide even more detailed feedback to a user. For example, when the tension of the pull cable 106 is within the adjustment value window 1002 for acceptable tension but near the thresholds 1004 or 1006, the third illuminator 1114 may blink slowly or be dimly illuminated, which blinking or brightness may increase eventually to solid or full bright as the tension is adjusted to be near the middle of the window 1002 and/or the ideal tension value. Similar effects can be provided for the first illuminator 1110 and the second illuminator 1112.

Turning now to FIG. 12, an example state table is provided in accordance with various embodiments. In addition to the visual indicator 1102 described above, or as part of the same visual indicator 218, a status LED illuminator may be included on the housing 202 of the cable pull switch 200 to provide visual indication of a present operational status of the cable pull switch. This status LED may be the same as or separate from the illuminators 1112, 1114, or 1116. Similarly, the communication port 222 may include the primary OSSD output and may include a second auxiliary output signal (e.g., AUX). These outputs may be provided on separate and distinct conductors or terminal pins, or may be contained with a serial communication protocol.

Various example states are shown in FIG. 12 in accordance with various embodiments. However, one of skill in the art will readily recognize that many variations are possible and are within the ambit of this disclosure. An initialization state 1202 may be entered upon initial power up or at other periodic intervals (e.g., once a day) to self check, establish communication, and/or for any other suitable purpose. The OSSD output may remain low (indicating a "do not run" condition to the associated machinery) while the AUX output may remain high. The status LED may provide a yellow illumination. An OFF state 1204 may be entered if the cable pull switch 200 is not running and has a tension that may require adjustment. The status LED may be red as a result and the OSSD output may remain low. A tensioned off state 1206 may be entered if the cable pull switch 200 is not running but has an acceptable tension on the pull cable 106. The status LED may be red and yellow, while the OSSD output remains low. A user can hit a reset button 114 and begin/resume a normal tensioned run state 1208. The normal tensioned run state 1208 is the normal operating state when the tension is acceptable and the cable pull switch 200 is on. The OSSD output will be high and the status LED may provide a green light. If the pull cable 106 is pulled, the cable pull switch 200 may enter a pulled state 1210 wherein the OSSD output will go low and the status LED may be illuminated solid red. Similarly, if the pull cable 106 goes slack, the cable pull switch 200 may enter a slack state 1212 wherein the OSSD output will go low and the status LED may be illuminated blinking red. If the tension on the pull cable 106 increases or decreases (e.g., due to thermal expansion or contraction) outside of an adjustment value window 1002, or outside of a different marginal tension window (for example, which may be smaller than the non-tripped value window 902 but larger than the adjustment value window 1002), the cable pull switch 200 may enter a marginal tension run state 1214 wherein the OSSD outputs will remain high (allowing the machinery to operate) but the status LED may blink green, thereby providing a warning that the tension is close to an artificial trip point and may require adjustment. The communication module 216 may provide outbound communication of any of these states, for example, to a central control computer or system, to provide feedback to a system manager of a current status and/or requirement to adjust tension of a particular pull cable 106.

Figure 13:
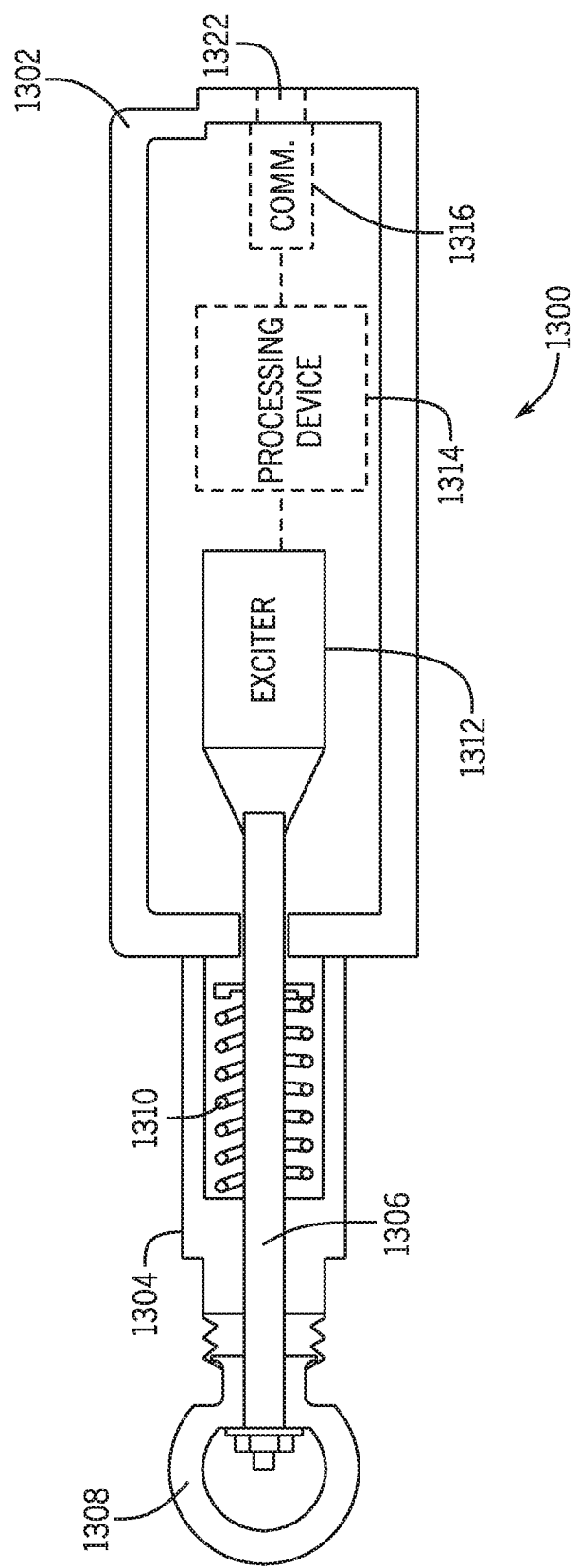
FIG. 13 shows a pull cable excitation module 1300 in accordance with various embodiments.

Turning now to FIG. 13, a pull cable excitation module 1300 is illustrated in accordance with various embodiments. The pull cable excitation module 1300 may, though not necessarily, include many of the same features and elements as the cable pull switch 200, including a housing 1302, a tubular body extension 1304, a shaft 1306, a D-ring 1308, and a spring 1310. In certain embodiments, the pull cable excitation module 1300 may even include a polychotomous sensor and/or an optional processing device 1314 in much the same manner as the cable pull switch 200 to perform the same or similar functionality as the cable pull switch 200 described above in addition to the additional features described below. Alternatively, the cable excitation module 1300 may not perform the same functions as the cable pull switch 200 and may instead be a separate dedicated functioning element according to the description below. A communication module 1316 and communication port 1322 may also be included, for example, as described above with respect to communication module 216 and port 222. The communication module 1316 may effect communication with a cooperating cable pull switch 200 to initiate a pull cable excitation state.

In various embodiments, the cable excitation module 1300 also includes a cable exciter 1312 mechanically coupled to the shaft 1306. The exciter 1312 may be a servo motor, a linear actuator, or another actuator capable of manipulating the shaft 1306. The exciter 1312 can, in turn, induce a mechanical tension or vibration onto the pull cable 106.

Figure 14:
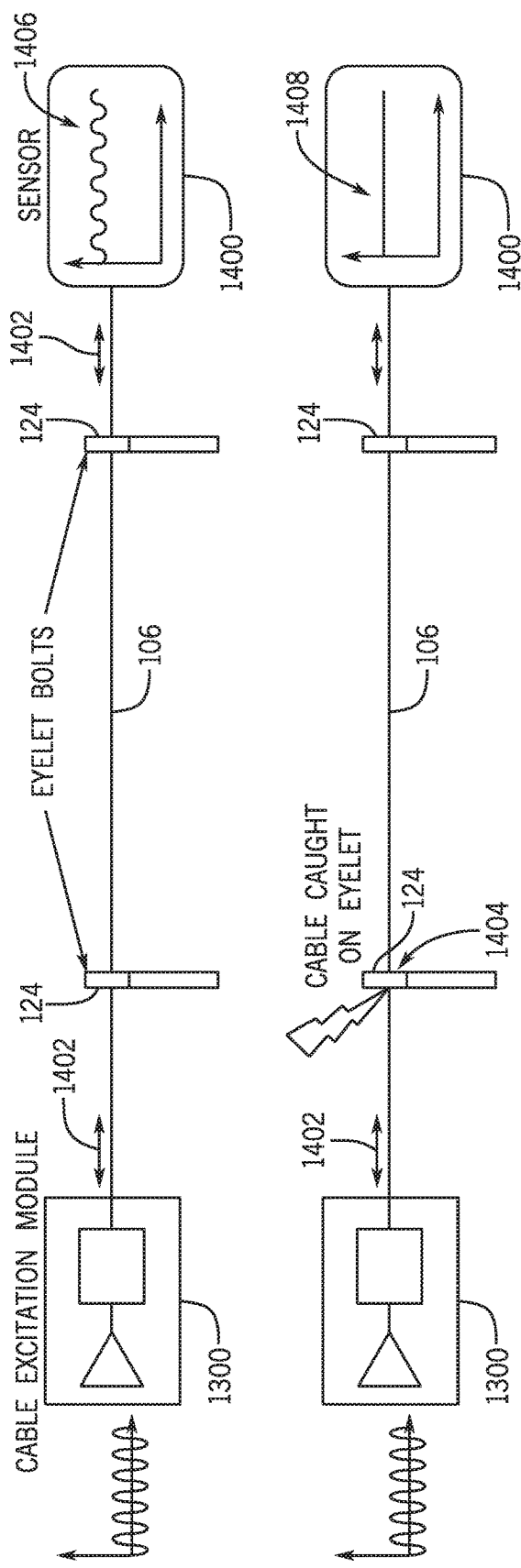
FIG. 14 shows a cable pull system illustrating functional aspects of the pull cable excitation module 1300 in accordance with various embodiments.

Turning now to FIG. 14, operation of the cable excitation module 1300 is illustrated in accordance with various embodiments. Coupled to a first end of the pull cable 106 is a cable pull switch 1400 (which may be the same as cable pull switch 200 and may include additional features now described) and attached to the second end of the pull cable 106 is the cable excitation module 1300. In operation, the cable excitation module 1300 and the pull cable switch 1400 can enter a cable excitation state. The cable excitation module 1300 can communicate with the cable pull switch 1400 to initiate the cable excitation state, and either the cable excitation module 1300 or the cable pull switch 1400 can initiate the cable excitation state. Alternatively or additionally, a separate master controller (not shown) can communicate with one or both of the cable excitation module 1300 or the cable pull switch 1400 to initiate the cable excitation state. The cable excitation state can be manually entered (e.g., by a user), or may periodically scheduled to ensure proper operation of the cable pull system. Once in the cable excitation state, the cable excitation module 1300 induces a varying tension 1402 onto the pull cable 106 by altering the tension exerted on the pull cable 106. This varying tension 1402 can most likely translate to linear movement of the pull cable 106. The varying tension 1402 may be varied in a slow or quick manner, may be a random pattern or a repeating pattern, and may be varied by small amounts (e.g., less than would normally be required for a cable pull event) and/or large amounts (e.g., more than would normally be required for a cable pull event).

The cable pull switch 1400 can detect at the first end of the pull cable 106 the varying tension 1402 exerted on the second of the pull cable 106 by the pull cable excitation module 1300. The detection may be made through one of the various polychotomous sensor techniques discussed above or via another sensing method. If the pull cable 106 is free of obstructions or other failures (e.g., is not caught on an eyelet 124), then the cable pull switch 1400 will detect the varying movement 1402 as is shown at 1406. Conversely, if the pull cable 106 is obstructed or is experiencing a condition that prevents translation of the varying tension 1402 (e.g., the cable 106 is caught in an eyelet 124 shown at 1404), the cable pull switch 1400 may fail to detect the varying tension 1402, or fail to detect the varying tension 1402 at an acceptable amplitude as is shown at 1408. In such an instance, the cable pull switch 1400 may generate an output signal indicative of a pull cable failure. By this, the cable pull system is tested to avoid a situation wherein the cable pull switch 1400 is inhibited from properly sensing a true cable pull event through obstruction or other pull cable failure. This also prevents a need for maintenance personnel to manually check the pull cables on a regular basis.

In other embodiments, the cable excitation module 1300 may attempt to clear or remove an obstruction or remedy a cable failure by exerting larger and/or quick tension bursts onto the pull cable 106. The pull cable 106 can be retested thereafter. The module 1300 may also log the cable failure event so that it can be remedied and/or addressed later.

Although the invention or inventions are described throughout this disclosure in terms of various apparatuses and devices, one of skill in the art will readily understand that the operational aspects and/or configurations disclosed herein may also be suitably described as one or more methods.

Various embodiments of the present invention may be embodied in many different forms, including, but in no way limited to, computer program logic for use with a processor (e.g., a microprocessor, micro controller, digital signal processor, server computer, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as C, C++, or JAVA) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) in a tangible storage medium, such as a semiconductor memory device (e.g., a RAM, ROM, PROM, EEPROM, or Flash-Programmable memory), a magnetic memory device (e.g., a diskette or fixed disk), an optical memory device (e.g., a CD-ROM), a PC card (e.g., PCMCIA card), or other memory device. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL).

Programmable logic may be fixed either permanently or temporarily in a tangible storage medium, such as a semiconductor memory device (e.g., a RAM, ROM, PROM, EEPROM, or Flash-Programmable memory), a magnetic memory device (e.g., a diskette or fixed disk), an optical memory device (e.g., a CD-ROM), or other memory device. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

The present disclosure describes preferred embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the invention may be combined in any suitable manner in one or more embodiments. In the description, numerous specific details are recited to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Although the above discussion discloses various exemplary embodiments of the invention, it should be apparent that those skilled in the art can make various modifications that will achieve some of the advantages of the invention without departing from the true scope of the invention.

What is claimed is:

1. A cable pull switch comprising:
a polychotomous cable pull sensor configured to provide a reading comprising at least one of a plurality of values, the reading corresponding to at least one of a tension on a pull cable or a linear displacement of a first end of a cable;
at least one processor coupled to the polychotomous cable pull sensor, the processor configured to:
determine a rate of change of the value of the reading from the sensor;
determine an occurrence of a cable pull event, the determination based at least in part on the determined rate of change of the value;
continuously monitor the reading;
periodically adjust an upper pull threshold value at a fixed interval of time if the rate of change of the value of the reading from the sensor is below a rate of change threshold; and periodically adjust a lower slack threshold value at the fixed interval of time if the rate of change of the value of the reading from the sensor is below a rate of change threshold.

2. The cable pull switch of claim 1, wherein the at least one processor is further configured to:
determine whether the rate of change of the value of an electrical resistance through the polychotomous cable pull sensor is below a threshold rate of change value; and
adjust an upper pull threshold value to a new upper pull threshold value that is based on a present reading of the value of the electrical resistance through polychotomous cable pull sensor.

3. The cable pull switch of claim 1, wherein the at least one processor is further configured to:
determine whether the reading is below a lower slack threshold value, the lower slack threshold value indicative of a cable slack event; and
generate an output signal indicative of the cable slack event in response to determining that the reading is below the lower slack threshold value.

4. The cable pull switch of claim 1 further comprising:
a pull cable excitation module configured to:
couple to a second end of the pull cable;
enter a pull cable excitation state by varying a tension exerted on the second end of the pull cable; and
communicate with the cable pull switch to initiate the pull cable excitation state;
wherein the cable pull switch is configured to:
detect at the first end of the pull cable the varying tension exerted on the second end of the pull cable during the pull cable excitation state; and
generate an output signal indicative of a pull cable failure in response to failing to detect the varying tension during the pull cable excitation state.

5. The cable pull switch of claim 1 further comprising:
a substrate configured to couple to a first end of the pull cable and configured to experience a variable mechanical stress related to a tension exerted by the pull cable; and
an electrical strain gauge bonded to the substrate and configured to alter an electrical resistance through the electrical strain gauge in proportion to the variable mechanical stress experienced by the substrate.

6. The cable pull switch of claim 5 further comprising:
a spring loaded shaft coupled to the substrate, the spring loaded shaft configured to be coupled to the pull cable and to slide along a longitudinal axis of the shaft to translate a tension exerted by the pull cable to the substrate.

7. The cable pull switch of claim 5, wherein the at least one processor is further configured to:
receive an indication of the value of the electrical resistance through the electrical strain gauge;
determine whether the value of the electrical resistance through the electrical strain gauge exceeds an upper pull threshold value, the upper pull threshold value being indicative of a cable pull event; and
generate an output signal indicative of the cable pull event in response to determining that the electrical resistance through the electrical strain gauge exceeds the upper pull threshold value.

8. The cable pull switch of claim 5, wherein the at least one processor is further configured to:
determine whether the value of the electrical resistance through the electrical strain gauge is below a lower slack threshold value, the lower slack threshold value indicative of a cable slack event; and
generate an output signal indicative of the cable slack event in response to determining that the electrical resistance through the electrical strain gauge is below the lower slack threshold value.

9. The cable pull switch of claim 5, wherein the variable mechanical stress is proportionate to the stress exerted by the pull cable.

10. The cable pull switch of claim 5, wherein the substrate is a metal substrate.

11. A cable pull switch comprising:
a polychotomous cable pull sensor configured to provide a reading comprising at least one of a plurality of values, the reading corresponding to at least one of a tension on a pull cable or a linear displacement of a first end of a pull cable;
at least one processing device coupled to the cable pull sensor, the processing device configured to:
receive the reading from cable pull sensor;
determine whether a value of the reading is outside of a non-tripped value window, a first limit edge side of the non-tripped value window comprising a pull threshold value, the pull threshold value being indicative of a cable pull event;
generate an output signal indicative of the cable pull event in response to determining that the value of the reading is outside of the non-tripped value window on the first limit edge side;
continuously monitor the reading;
determine a rate of change of the value of the reading from the sensor;
periodically adjust an upper pull threshold value at a fixed interval of time if the rate of change of the value of the reading from the sensor is below a rate of change threshold;
periodically adjust a lower slack threshold value at the fixed interval of time if the rate of change of the value of the reading from the sensor is below a rate of change threshold; and
determine an occurrence of a cable pull event, the determination based at least in part on the determined rate of change of the value.

12. The cable pull switch of claim 11, wherein the at least one processing device is further configured to:
determine whether the value of the reading is outside of the non-tripped value window, a second limit edge side of the non-tripped value window comprising a slack threshold, the slack threshold indicative of a cable slack event; and
generate an output signal indicative of the cable slack event in response to determining that the value of the reading is outside of the non-tripped value window on the second limit edge side.

13. The cable pull switch of claim 11, wherein the at least one processing device is further configured to:
determine whether the reading is below a lower slack threshold value, the lower slack threshold value indicative of a cable slack event; and
generate an output signal indicative of the cable slack event in response to determining that the reading is below the lower slack threshold value.

14. The cable pull switch of claim 11, further comprising:
a pull cable excitation module configured to:
couple to a second end of the pull cable;
enter a pull cable excitation state by varying a tension exerted on the second end of the pull cable; and communicate with the cable pull switch to initiate the pull cable excitation state;

wherein the cable pull switch is configured to:

detect at the first end of the pull cable the varying tension exerted on the second end of the pull cable during the pull cable excitation state; and generate an output signal indicative of a pull cable failure in response to failing to detect the varying tension during the pull cable excitation state.

15. A cable pull switch comprising:

a polychotomous cable pull sensor configured to provide a reading comprising at least one of a plurality of values, the reading corresponding to at least one of a tension on a pull cable or a linear displacement of a first end of a pull cable;

at least one processor coupled to the polychotomous cable pull sensor, the processor configured to:

determine a rate of change of the value of the reading from the sensor;

determine whether a rate of change of the reading is outside of a non-tripped value window, a first limit edge side of the non-tripped value window comprising a pull threshold value, the pull threshold value being indicative of a cable pull event;

determine an occurrence of a cable pull event based on determining that rate of change of the value of the reading is outside of the non-tripped value window on the first limit edge side;

continuously monitor the reading;

periodically adjust an upper pull threshold value at a fixed interval of time if the rate of change of the value of the reading from the sensor is below a rate of change threshold;

periodically adjust a lower slack threshold value at the fixed interval of time if the rate of change of the value of the reading from the sensor is below a rate of change threshold; and determine the occurrence of a cable pull event, the determination based at least in part on the determined rate of change of the value.

16. The cable pull switch of claim 15, wherein the at least one processor is further configured to:

determine whether the value of the reading is outside of the non-tripped value window, a second limit edge side of the non-tripped value window comprising a slack threshold, the slack threshold indicative of a cable slack event; and generate an output signal indicative of the cable slack event in response to determining that the value of the reading is outside of the non-tripped value window on the second limit edge side.

17. The cable pull switch of claim 15, wherein the at least one processor is further configured to:

determine whether the value of the linear displacement is outside of the non-tripped value window on the first limit edge side by determining whether the value of the linear displacement exceeds the pull threshold value.

18. A cable pull switch comprising:

a polychotomous cable pull sensor configured to provide a reading comprising at least one of a plurality of values, the reading corresponding to at least one of a tension on a pull cable or a linear displacement of a first end of a pull cable;

at least one processor coupled to the polychotomous cable pull sensor, the processor configured to:

determine a rate of change of the value of the reading from the sensor;

determine an occurrence of a cable pull event, the determination based at least in part on the determined rate of change of the value;

determine whether the rate of change of the value of an electrical resistance through the polychotomous cable pull sensor is below a threshold rate of change value; and adjust an upper pull threshold value to a new upper pull threshold value that is based on a present reading of the value of the electrical resistance through polychotomous cable pull sensor.

* * * * *